(12) United States Patent
Andrew et al.

(10) Patent No.: US 10,892,399 B2
(45) Date of Patent: Jan. 12, 2021

(54) POWERLESS MAGNETIC FIELD SENSING USING MAGNETOELECTRIC NANOWIRES

(71) Applicant: University of Florida Research Foundation, Inc., Gainesville, FL (US)

(72) Inventors: Jennifer S. Andrew, Gainesville, FL (US); David P. Arnold, Gainesville, FL (US); Matthew Bauer, Gainesville, FL (US); Xiao Wen, Beaverton, OR (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 269 days.

(21) Appl. No.: 16/188,457

(22) Filed: Nov. 13, 2018

(65) Prior Publication Data

US 2019/0148620 A1  May 16, 2019

Related U.S. Application Data

(60) Provisional application No. 62/585,198, filed on Nov. 13, 2017.

(51) Int. Cl.
| | |
|---|---|
| *H01L 41/12* | (2006.01) |
| *H01L 41/06* | (2006.01) |
| *G01R 33/06* | (2006.01) |
| *H01L 41/47* | (2013.01) |
| *H01L 41/20* | (2006.01) |
| *G01R 33/02* | (2006.01) |
| *G01R 33/07* | (2006.01) |
| *H01L 41/00* | (2013.01) |
| *H01L 41/16* | (2006.01) |

(52) U.S. Cl.
CPC ............ *H01L 41/125* (2013.01); *G01R 33/02* (2013.01); *G01R 33/06* (2013.01); *G01R 33/07* (2013.01); *H01L 41/06* (2013.01); *H01L 41/20* (2013.01); *H01L 41/47* (2013.01); *H01L 41/00* (2013.01); *H01L 41/16* (2013.01)

(58) Field of Classification Search
CPC ....... H01L 41/125; H01L 41/06; H01L 41/47; H01L 41/20; H01L 41/00; H01L 41/16; G01R 33/02; G01R 33/07; G01R 33/06
See application file for complete search history.

(56) References Cited

U.S. PATENT DOCUMENTS

| | | | |
|---|---|---|---|
| 5,438,990 | A | 8/1995 | Wahlstrand et al. |
| 8,241,651 | B2 | 8/2012 | Lahann |
| 2009/0001983 | A1* | 1/2009 | Wittkowski ........... G01R 33/06 324/260 |

FOREIGN PATENT DOCUMENTS

| | | |
|---|---|---|
| WO | 2005118925 A2 | 12/2005 |
| WO | 2009103737 A1 | 8/2009 |

\* cited by examiner

*Primary Examiner* — Mohamad A Musleh
(74) *Attorney, Agent, or Firm* — Thomas | Horstemeyer, LLP

(57) ABSTRACT

Embodiments of a magnetic field sensor of the present disclosure includes magnetoelectric nanowires suspended above a substrate across electrodes without substrate clamping. This results in enhanced magnetoelectric coupling by reducing substrate clamping when compared to layered thin-film architectures. Accordingly, the magnetoelectric nanowires of the magnetic field sensor generate a voltage response in the presence of a magnetic field.

23 Claims, 25 Drawing Sheets

POWERLESS MAGNETIC FIELD SENSING USING MAGNETOELECTRIC NANOWIRES

CROSS-REFERENCE TO RELATED APPLICATION

This application claims priority to U.S. provisional application entitled, "Powerless Magnetic Field Sensing Using Magnetoelectric Nanowires," having Ser. No. 62/585,198, filed Nov. 13, 2017, which is entirely incorporated herein by reference.

STATEMENT REGARDING FEDERALLY SPONSORED RESEARCH OR DEVELOPMENT

This invention was made with government support under IIP1439644 awarded by National Science Foundation. The government has certain rights in the invention.

TECHNICAL FIELD

The present disclosure is generally related to magnetic field sensors.

BACKGROUND

Current magnetic field sensors, such as Hall sensors, require power to operate which is a major limitation. While other types of magnetic field sensors, such as those utilizing magnetoelectric materials, are low powered, an additional major obstacle for such conventional magnetoelectric sensors is that composite strain mediated magnetoelectrics, which currently demonstrate the highest magnetoelectric coefficients, suffer from substrate clamping when in a thin film architecture which greatly reduces their magnetoelectric effect.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 21A-B are schematic diagrams of a lock-in magnetoelectric measurement setup for the nanowire array in accordance with embodiments of the present disclosure, in which FIG. 21A depicts a top view and FIG. 21B depicts a side view of the lock-in magnetoelectric measurement setup.

DETAILED DESCRIPTION

Figure 1A:
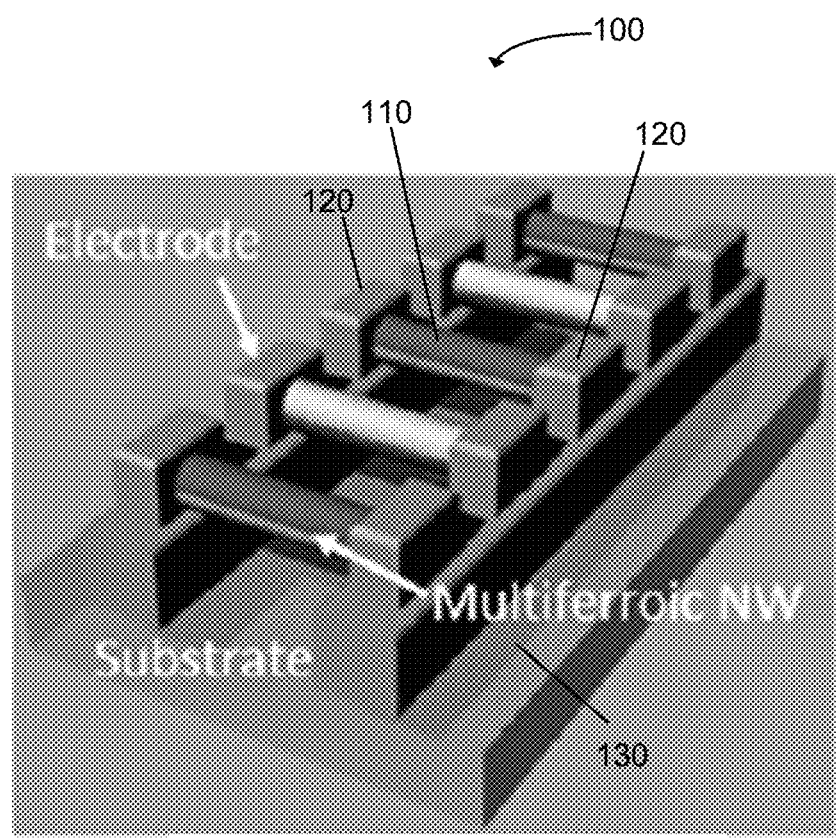
FIG. 1A is a diagram of a magnetic field sensor comprising a magnetoelectric nanowire spanning across electrodes in accordance with embodiments of the present disclosure.

Magnetoelectrics can offer a lower power alternative to current commercial magnetic field sensors such as Hall Sensors. One major obstacle for such sensors is that composite strain mediated magnetoelectrics, which currently demonstrate the highest magnetoelectric coefficients, suffer from substrate clamping when in a thin film architecture, which greatly reduces their magnetoelectric effect. Embodiments of novel zero magnetic field sensors of the present disclosure overcome this obstacle by using magnetoelectric nanowires spanning or suspended above the substrate across electrodes (without clamping). This results in enhanced magnetoelectric coupling by reducing substrate clamping when compared to layered thin-film architectures.

For example, an exemplary embodiment of the present disclosure is directed to a low-power passive magnetic field sensor utilizing magnetoelectric nanowires with enhanced magnetoelectric coupling. In one embodiment, nanowires are arranged across a gap separating opposing electrodes, such as inter-digitated electrodes, among others. In one embodiment, the nanowires are assembled with a solvent to arrange the nanowires suspended across the gap of the electrodes using dielectrophoretic force. In particular, the nanowires can be assembled to formed ordered arrays on the inter-digitated electrodes using dielectrophoresis and the creation of electrical contacts, in one embodiment.

In dielectrophoresis, a nanowire placed in an AC electric field becomes polarized relative to its medium and the resulting dipole experiences a force along the gradient of the electric field. In a nonuniform electric field, the force on one end of the dipole is greater than the other end, resulting in a net force called the dielectrophoretic force. As the dielectrophoretic force is determined by the electrical properties of the nanowires and the solvent used, adjusting these properties may improve or alter performance of various embodiments.

Although single phase magnetoelectrics exist, they are comparatively rare. On the other hand, composite magnetoelectrics are capable of producing greater magnetoelectric effects. For magnetoelectrics, the figure of merit is the magnetoelectric coefficient ($\alpha$), which is quantified as the magnitude of the electric field (dE) generated in the material in response to an applied magnetic field (dH), $\alpha = dE/dH$.

Composite magnetoelectrics are typically comprised of magnetostrictive and piezoelectric phases which share an interface. When exposed to an applied magnetic field, the magnetostrictive phase undergoes a shape change, which in turn imparts a strain to the piezoelectric phase, thereby inducing an electrical polarization. When magnetoelectric composites are fabricated as thin films, the strain transfer between the magnetostrictive and piezoelectric phases is limited by the underlying substrate leading to a reduction in the magnetoelectric effect. As such, less rigidly clamped 1-D magnetoelectric nanostructures can offer increased magnetoelectric coefficients. Enhancements of up to a few orders of magnitude are feasible based on theoretical and preliminary scanning probe microscopy measurements. Thus, to make use of magnetoelectric nanowires demands, nanomanufacturing processes are contemplated that enable (a) the synthesis of nanowires with controlled length, (b) the ability to direct the assembly of these nanowires into ordered arrangements while avoiding substrate clamping effects, and (c) the ability to make suitable electrical connections to one or more nanowires.

Fabrication

In accordance with the present disclosure, embodiments of an improved magnetic field sensor 100 are fabricated from one or more magnetoelectric biphasic fibers 110 connected to electrodes 120 (FIG. 1A) and thereby utilize the increased magnetoelectric coefficients that such 1-D structures offer. Specifically, in one embodiment, the barium titanate and cobalt ferrite system is selected for the 1-D magnetoelectric structure, as it has a significant magnetoelectric effect in bulk and thin film form. In particular, a bilayer, Janus, morphology is chosen to promote the bending mode in the magnetoelectric. Other embodiments may utilize different materials for the 1-D magnetoelectric structure, e.g., nanowire, such as a composite of PZT (lead zirconate titanate) and nickel zinc (NiZn) ferrite materials, among others.

To fabricate the device 100, an exemplary method is implemented by (1) fabricating 1-D magnetoelectric nanofibers; (2) forming 1-D magnetoelectric nanowires from the 1-D magnetoelectric nanofibers; (3) orienting the 1-D magnetoelectric nanowires 110 across electrodes 120 (without clamping); and (4) establishing upper electrical contacts. During testing, the magnetoelectric sensitivity (dV/dH) of the resultant sensor devices 100 can be measured.

Figure 1B:
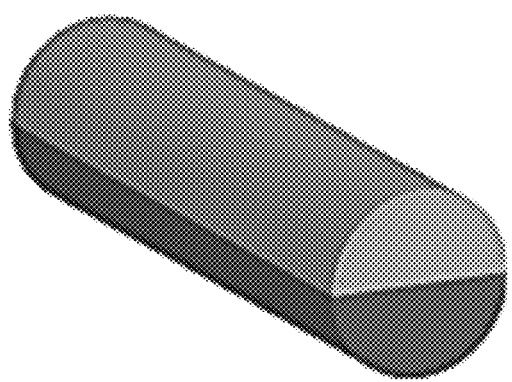
FIG. 1B-1D are diagrams of nanowire morphologies having a respective Janus morphology, core shell morphology, and a randomly dispersed morphology in accordance with various embodiments of the present disclosure.
Figure 1C:
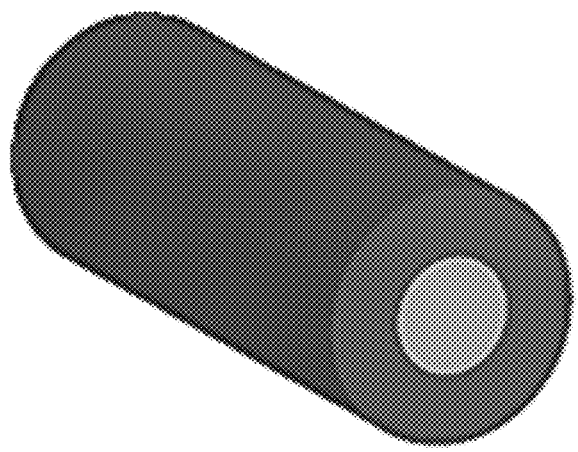
Figure 1D:
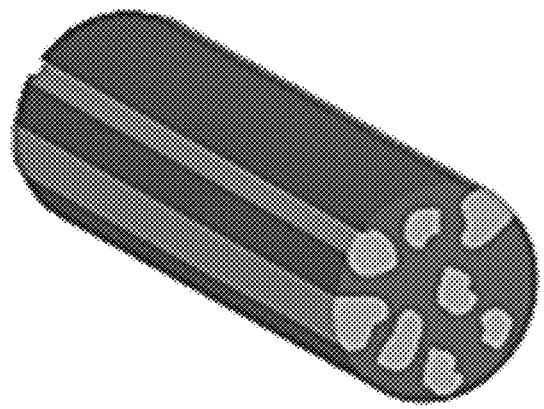

Several methods exist to fabricate 1-D magnetoelectrics including sol-gel electrospinning, hydrothermal synthesis, and various chemical and physical vapor deposition processes. In one embodiment of the present disclosure, sol-gel electrospinning is used to fabricate the 1-D magnetoelectrics, as it is capable of producing magnetoelectrics with a wide range of compositions and various interconnectivities including fibers with Janus, core shell, and randomly dispersed morphologies. For illustration, FIG. 1B is a diagram depicting a nanowire with a Janus morphology, FIG. 1C depicts a core shell morphology, and FIG. 1D depicts a randomly dispersed morphology for a nanowire in accordance with various embodiments of the present disclosure.

The following exemplary method describes steps for fabricating a nanowire using sol-gen electrospinning in accordance with one non-limiting embodiment. Other alternative sol-gel electrospinning techniques may also be performed in accordance with the present disclosure in order to fabricate the resultant nanofibers and nanowires.

In sol-gel electrospinning, a ceramic/polymer solution is drawn, often from a syringe needle, into a nanofiber using a large electric field applied between the solution and a counter electrode. For example, as the sol-gel is extruded from the syringe needle, a surface charge forms due to the applied electric field. Once the solution accumulates a sufficient charge, it is pulled toward the counter-electrode in a shape referred to as a Taylor cone, emitted from the cone from the electrostatic force between the charged sol-gel and counter electrode as a polymer/ceramic precursor jet, and accelerated toward the counter-electrode by the applied electric field forming amorphous nanofibers. The morphology of the fibers are controlled by solution and electrospinning parameters, in which the solution parameters include viscosity, conductivity, and dielectric constant, and the electrospinning parameters included applied field, flow rate, and humidity, among others. A high temperature calcination step is utilized to burn off the polymer in the electrospinning solution and crystallize the ceramics used. In particular, a calcination step with a fast ramp rate may be used to quickly burn off the polymer from the fibers, shrinking them axially, and breaking them apart into shorter nanowires. The dimensions of the nanowires can be controlled by the electrospinning field and calcination ramp rate.

Next, an exemplary method for fabricating magnetoelectric nanofibers in accordance with the present disclosure is described. First, the barium titanate and cobalt ferrite sol-gel precursor solutions are prepared. In particular, a barium titanate ceramic solution may be prepared by dissolving 0.4246 g barium acetate in 3 ml acetic acid at 80° C. under constant stirring, followed by cooling to room temperature. After approximately 1 hour, 0.4925 ml of titanium isopropoxide may then be added. Simultaneously, a polymer solution may be prepared by dissolving 0.4 g polyvinylpyrrolidone in 3 ml ethanol under constant stirring. After an additional hour, the ceramic solution can be added dropwise to the polymer solution under constant stirring.

Similarly, a cobalt ferrite ceramic solution can be prepared by dissolving 0.48373 g cobalt nitrate hexahydrate and 1.342 g ferric nitrate nonahydrate in 2 ml of acetic acid and 0.75 ml ethanol. After stirring for approximately 1 hour, 0.412 ml acetylacetone may be added. Simultaneously, a polymer solution can be prepared by dissolving 0.4 g polyvinylpyrrolidone in 3 ml ethanol. After an additional hour, the ceramic solution may then be added dropwise to the polymer solution under constant stirring.

Figure 2:
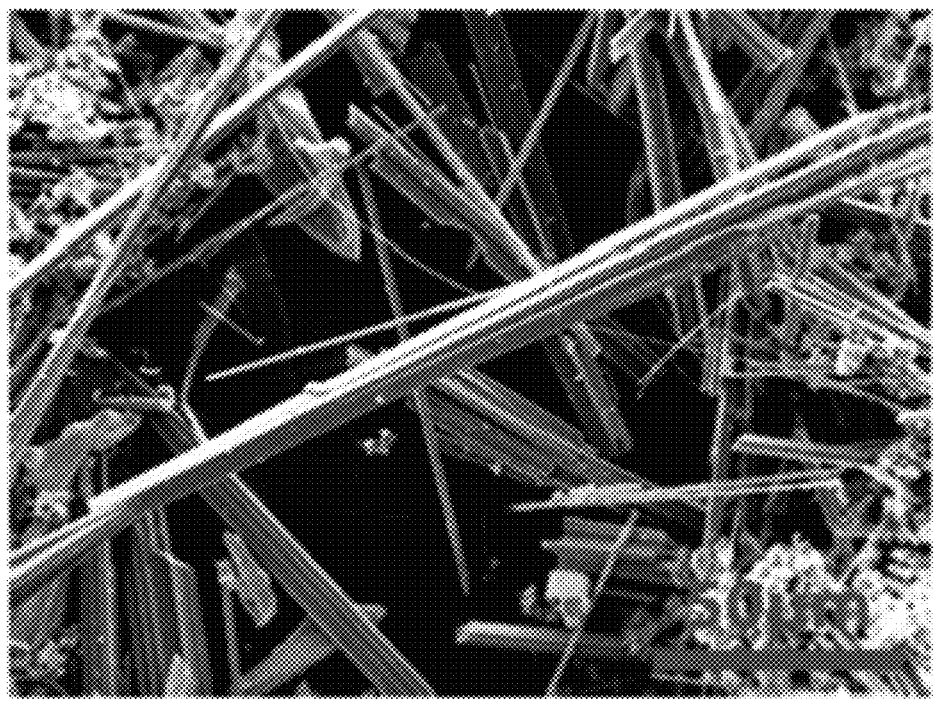
FIG. 2 is a scanning electron microscope image of an as calcined magnetoelectric nanowire in accordance with embodiments of the present disclosure.

Thereafter, both solutions are co-electrospun side by side to form Janus nanofibers, with one hemisphere of the fiber containing cobalt ferrite and the other barium titanate. To prevent sintering together of nearby nanowires, the ceramic/polymer Janus nanofibers are then calcined (e.g., in sodium chloride), thereby burning off the polymer, shrinking the fibers, and breaking them along their length, and crystallizing the amorphous as-spun ceramic at 1100° C. After salt calcination, the salt and nanowires may be immersed in water to dissolve the salt, and then, the nanowires may be removed from the water and salt solution. A dilute hydrochloric acid (HCl) wash may be used to remove remaining barium carbonate (BCO) that forms on the surface of nanowires. For illustration, FIG. 2 shows a scanning electron microscope image of an as calcined nanowire 110 in accordance with an embodiment of the present disclosure.

As discussed, a calcination step with a fast ramp rate may be used to quickly burn off the polymer from the fibers. For assembly a nanowire slightly longer than the electrode gap is desirable since the nanowire must bridge the electrode gap for electrical connections to be made and nanowires which are too long may quickly settle out of solution. As such, electrospinning and calcination parameters can be selected to provide control of the nanowire lengths. Two such parameters in various embodiments are the electrospinning voltage, as a means to control the as-spun fiber diameter and calcination ramp rate. Though these are not the only parameters which could control nanowire length, they can be readily applied to other systems.

Figure 3:
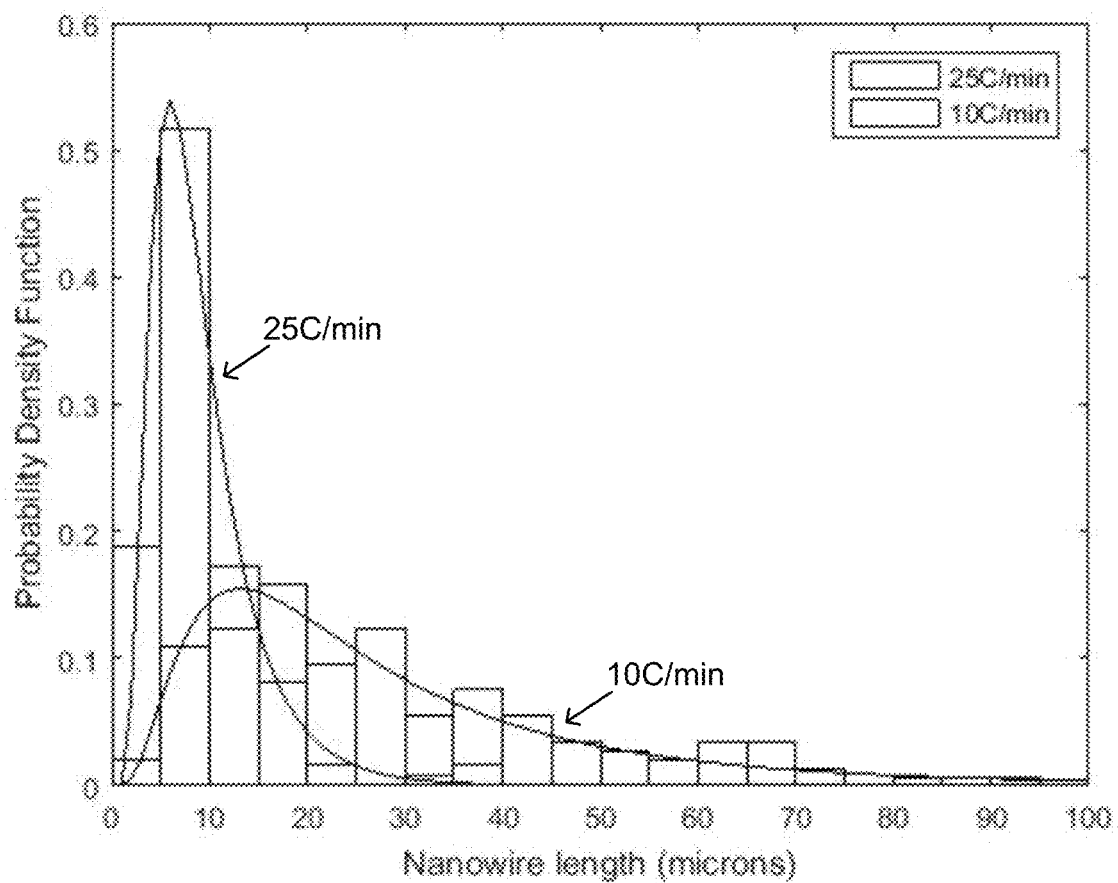
FIG. 3 is a graph illustrating the relationship between nanowire lengths and calcination ramp rates during magnetoelectric nanowire fabrication in accordance with embodiments of the present disclosure.

Correspondingly, FIG. 3 shows a decrease in nanowire lengths during testing when the calcination ramp rate is increased from 10° C. min$^{-1}$ to 25° C. min$^{-1}$ which is demonstrative in showing that an increased ramp rate leads to faster polymer burn off, increases the rate of shrinkage along the axis of the nanowire and axial tension, and leads to the breakup of the fibers into shorter nanowires. FIG. 3 shows a decrease in nanowire lengths from 29.06 μm±19.34 μm to 19.34 μm±6.08 μm when the calcination ramp rate was increased from 10° C. min$^{-1}$ to 25° C. min$^{-1}$. Correspondingly, as-spun nanofibers with larger diameters may in turn produce longer nanowires.

The electrospinning voltage can be readily tuned to control the fiber diameter, where higher electrospinning voltages result in smaller diameter fibers. This is because an increase in applied field should produces a larger elongating force on the fiber jet during electrospinning, leading to smaller diameter nanofibers, which given the same calcination ramp rate would form similar aspect ratio, and thus shorter nanowires.

Figure 4:
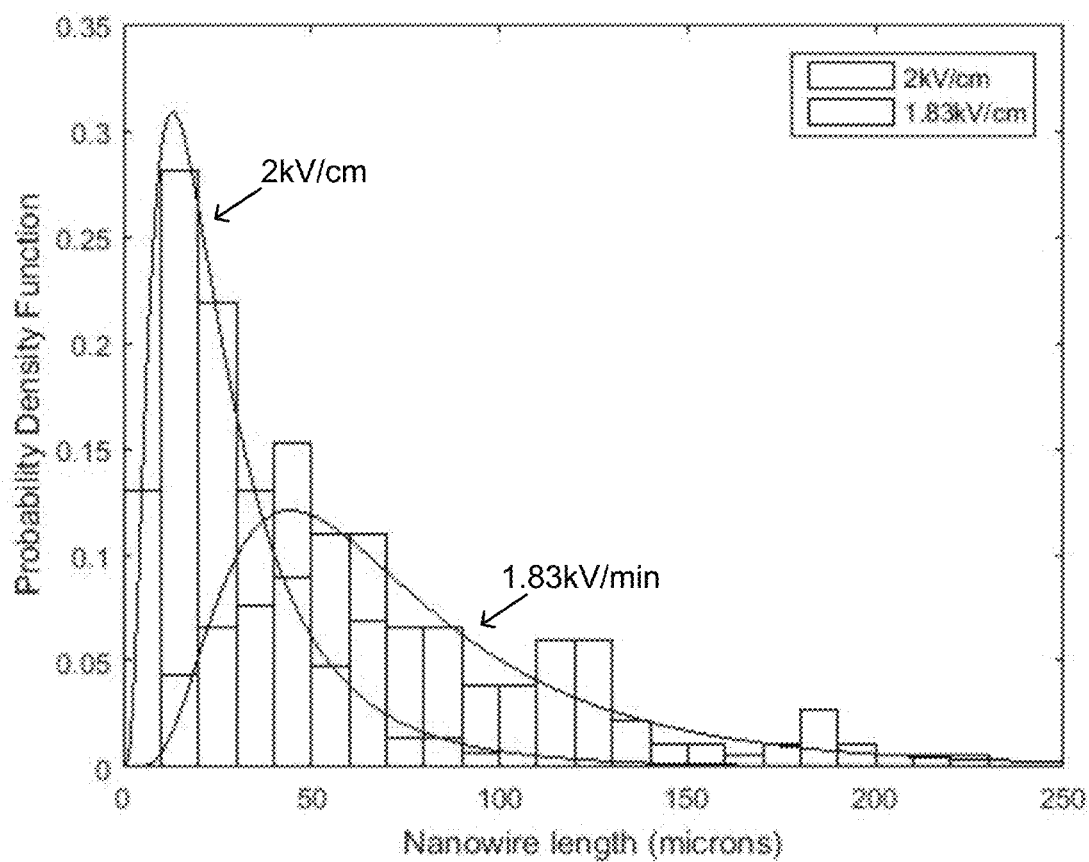
FIGS. 4-5 are graphs illustrating the relationships between nanowire lengths and electrospinning voltage and/or nanowire diameters during electrical assembly of magnetoelectric nanowire fabrication in accordance with embodiments of the present disclosure, in which FIG. 4 provides a plot of probability density function versus nanowire lengths and FIG. 5 provides a plot of nanowire lengths versus nanowire diameters.
Figure 5:
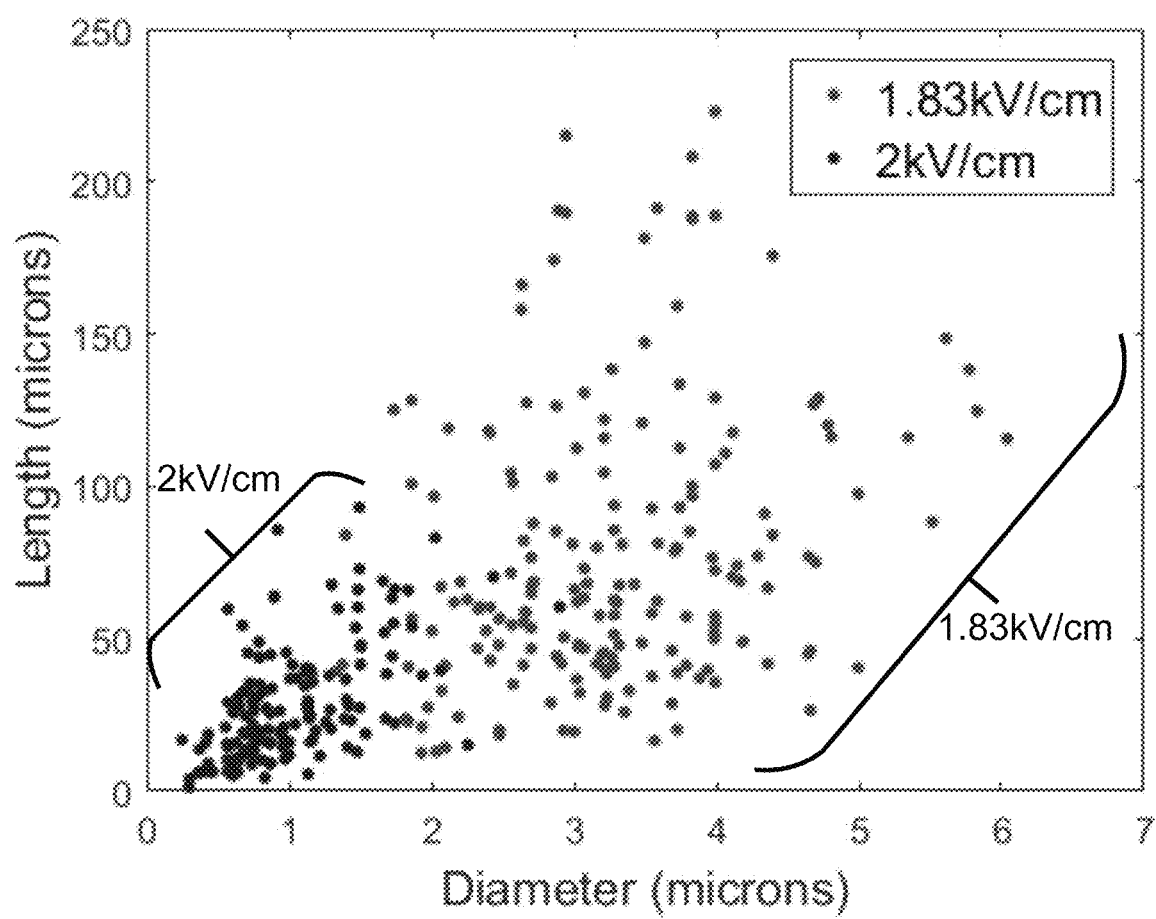

Accordingly, FIGS. 4-5 show that an increase in electrospinning voltage from 1.83 kV cm$^{-1}$ to 2 kV cm$^{-1}$ leads to the formation of smaller diameter nanofibers, which given the same calcination ramp rate form a similar aspect ratio, and thus shorter nanowires. Correspondingly, FIGS. 4-5 demonstrate that a decrease in electrospinning field from 2 kV cm$^{-1}$ to 1.83 kV cm$^{-1}$ resulted in longer nanowires, increasing the length from 29.06 μm±19.34 μm with 2 kV cm$^{-1}$ to 77.43 μm±46.11 μm with 1.83 kV cm$^{-1}$, and larger diameter fibers with similar aspect ratios. This is also supported by the positive correlation coefficient between nanowire length and diameter as shown in FIG. 5 of R=0.604 with a p-value of p<0.01 (>99% confidence level). It is also important to note the heteroskedasticity in FIG. 5; i.e. that an increasing nanowire diameter is positively correlated with increased nanowire length, but also increased length variation. This makes long nanowires, if desirable, currently more difficult to fabricate. In accordance with various embodiments, nanowires having diameters of 10 nm to 1000 nm (or larger) can be fabricated in accordance with the present disclosure. However, exemplary nanowires of the present disclosure are not limited to these dimensions.

Figure 6:
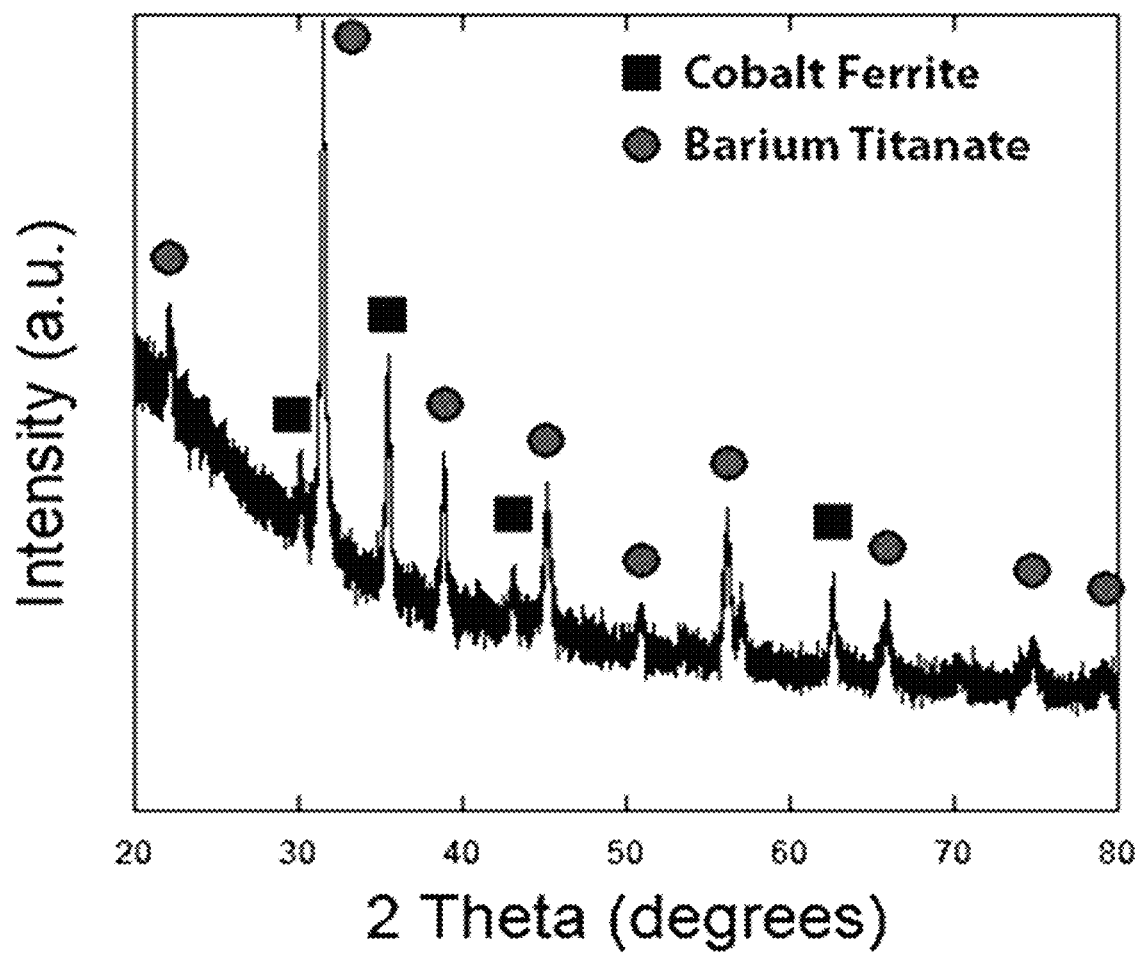
FIG. 6 depicts an X-ray diffraction spectra analysis of calcined barium titanate and cobalt ferrite nanowires in accordance with embodiments of the present disclosure.
Figure 7:
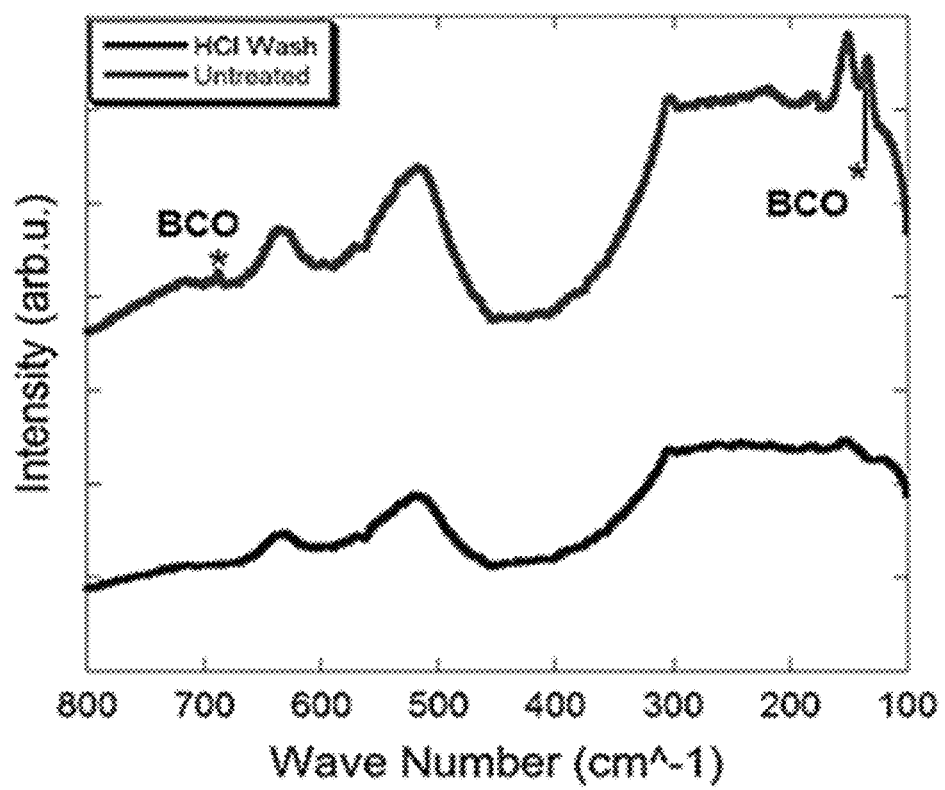
FIG. 7 depicts a Raman spectra analysis of single phase barium titanate nanowires used to test a process for removing barium carbonate impurities in accordance with embodiments of the present disclosure.

To verify the crystal structure of the calcined barium titanate and cobalt ferrite nanowires, X-ray diffraction (XRD) was performed, as depicted in FIG. 6. Then, the results were analyzed using Rietveld refinement. From this, the fibers were found to be comprised of 62 wt % tetragonal barium titanate, P4 mm, and 38 wt % spinel cobalt ferrite, Fd-3m. The agreement indices of the refinement, $R_{expected}$=5.19, $R_{weighted}$=5.49, and $\chi^2$=1.26, indicate that these are indeed the structures present and that there are low levels of or no crystalline impurities. Though XRD showed no impurities, barium carbonate surface impurities have been observed in as-calcined barium titanate nanowires formed via sol gel electrospinning. The removal of this impurity was tested via acid treatment with dilute HCl in single phase barium titanate nanowires using Raman spectroscopy, in which single phase wires were used for this test so that any signal from the cobalt ferrite phase would not obscure the barium carbonate peaks. From FIG. 7, one may see that the barium titanate phase contains barium carbonate peaks which are no longer present after acid treatment, showing that a dilute HCl treatment can remove the barium carbonate impurity from the as-calcined wires.

Assembly

To assemble the magnetoelectric Janus nanowires across parallel electrodes to form our devices we dispersed them in solution and utilized an AC electrical assembly technique. To position the nanofibers across parallel electrodes 120 in one embodiment, a method which would not expose the substrate 130 to high temperatures required for calcination is desired. Correspondingly, while lower thermal treatment or calcination temperatures can be used, this would be at the expense of the ferroelectric and magnetostrictive properties of the barium titanate and cobalt ferrite, respectively. Therefore, a generalizable approach to avoid damage to other magnetic field sensor device or chip components while allowing calcination to be performed at an optimal temperature for any arbitrary magnetoelectric system is implemented by first performing calcination off-chip then subsequently assembling them for the magnetic field sensor device 100 in certain embodiments. For example, when combined with a bottom up assembly technique, the high temperature calcination step can be performed off substrate making it CMOS compatible and feasible for application in a manufacturing setting.

In AC electrical assembly, a nanowire, or particle, suspended in solution spontaneously forms a dipole, and experiences a force along the gradient of the electric field referred to as the dielectrophoretic force. Other forces present include dipole-dipole interactions, electrostatics, capillary forces, and AC-electroosmosis. These other forces can cause repulsion or chaining between nearby nanowires, adhesion to the substrate, disruption of nanowires upon drying, and a flow of solvent around the nanowires, respectively, to varying extents depending on the assembly parameters, such as the electrical and rheological properties of the nanowires and solvent. As AC electrical assembly is highly dependent on the electrical properties, namely conductivity and permittivity, of the solvent and particles used, electrical assembly of the Janus nanowires may be attempted in various solvents for different embodiments that include water, ethanol, 2-methoxyethanol, and butanol.

Figure 8:
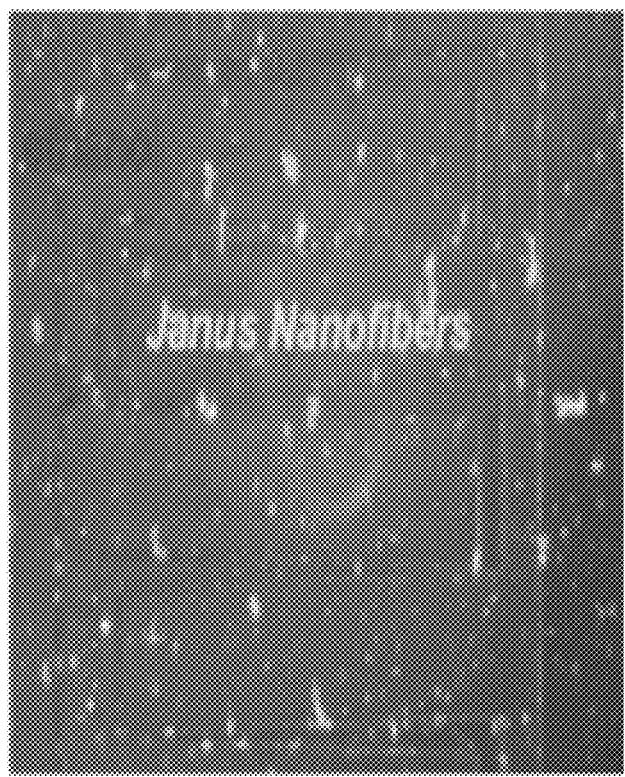
FIGS. 8-10 are images of electrical assembly of magnetoelectric nanowires using various solvents in accordance with embodiments of the present disclosure, in which an ethanol solvent solution was used for FIG. 8, a 2-methoxyethanol solvent solution was used for FIG. 9, and a butanol solvent solution was used for FIG. 10.
Figure 9:
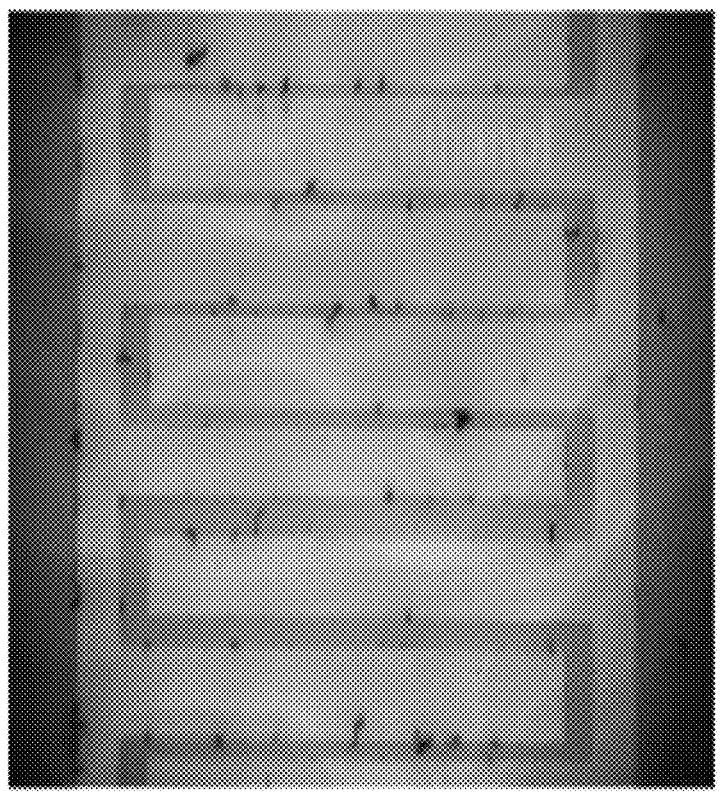
Figure 10:
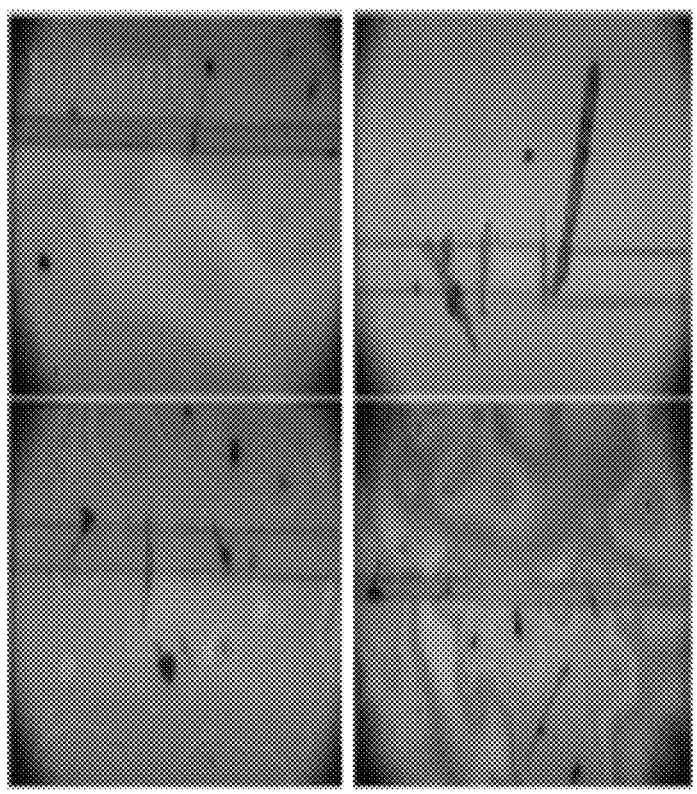
Figure 11:
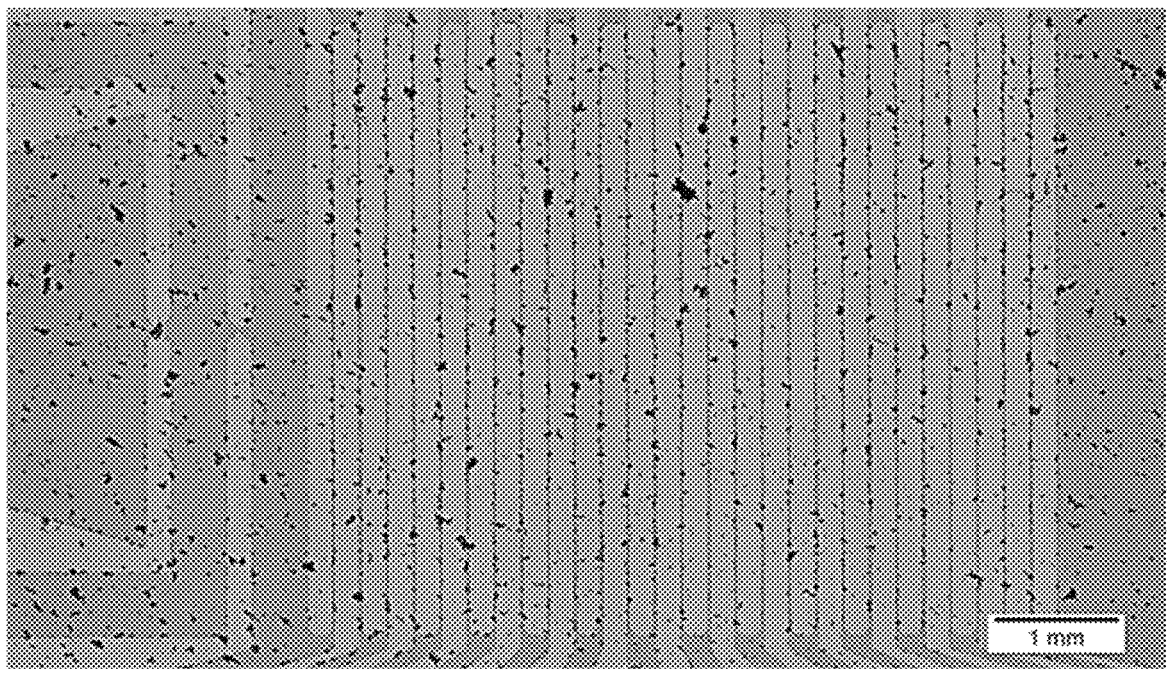
FIG. 11 is a scanning electron microscope image of an assembly of Janus nanowires in butanol in accordance with embodiments of the present disclosure.

In some embodiments, permittivity of the solution relative to the nanowires is decreased in order to promote an increase in the dielectrophoretic force. Thus, assembly is performed in solutions of ethanol (FIG. 8), 2-methoxyethanol (FIG. 9), and butanol (FIG. 10), in various embodiments. During trials, assembly in each of these solvents showed good positive dielectrophoresis; however the ethanol evaporated rather rapidly, not allowing much time for assembly to occur. As such, butanol was selected for the subsequent assemblies which led to good assembly in the test arrays which allowed individual nanowire rows to be measured (FIG. 11).

During subsequent trials, good assembly was observed when most of the nanowires received a sufficiently thick metal coating (e.g., copper) along each section of their lengths on one side. Further, removing a barium carbonate ($\varepsilon_r \approx 8.5$) impurity from the Janus nanofibers/wires slightly improved assembly, and greatly improved assembly of single phase barium titanate fibers.

Therefore, in various embodiments, nanowires 110 are assembled after first coating them in a sacrificial metal coating (e.g., copper) which can be later removed from the wires post assembly. In an exemplary embodiment, a goal to obtain improved assembly guided by the dielectrophoretic (DEP) force equation for a sphere with ohmic loss is given as follows:

$$\langle \vec{F}_{DEP} \rangle \geq 2\pi \varepsilon_m R^3 Re[K(\omega)] \nabla E^2_{RMS} \quad \text{(Eq. 1)}$$

where the $2\pi R^3$ is the shape factor related to the spherical geometry and $\nabla E$ is the gradient of the applied electric field. The complex Clausius Mossotti factor $$K(\omega) = (\varepsilon_p - \varepsilon_m - j(\sigma_p - \sigma_m)/\omega)/(\varepsilon_p + 2\varepsilon_m - j(\sigma_p + 2\sigma_m)/\omega) \quad \text{(Eq. 2)}$$

determines the direction of the dielectrophoretic force with Re(K)>0 giving the desired positive dielectrophoretic force, which is an attraction of the nanowires toward the electric field gradient maxima, i.e. the corners of the electrodes. The subscripts p and m denote the particle and medium, respectively, and $\varepsilon$ and $\sigma$, denote their permittivity and conductivity, respectively.

As can be seen from Equation 1, the dielectrophoretic force is dependent on the frequency and magnitude of the applied AC electric field as well as the electrical permittivity and conductivity of the particle/nanowire in solution and the solvent used. As such, one can tune these electrical factors to obtain strong positive dielectrophoresis, attraction of the nanowires 110 across the electrode gap, weak dielectrophoresis, or even negative dielectrophoresis repulsion of the nanowires from the electrode gap. In general conductive wires or particles tend to exhibit positive dielectrophoresis below a certain cutoff frequency, $\omega = (\sigma_p + 2\sigma_m)/(\varepsilon_p + \varepsilon_m)$, and dielectrics with high permittivities, compared to the solvent used, tend to exhibit positive dielectrophoresis above this cutoff frequency.

Figure 12:
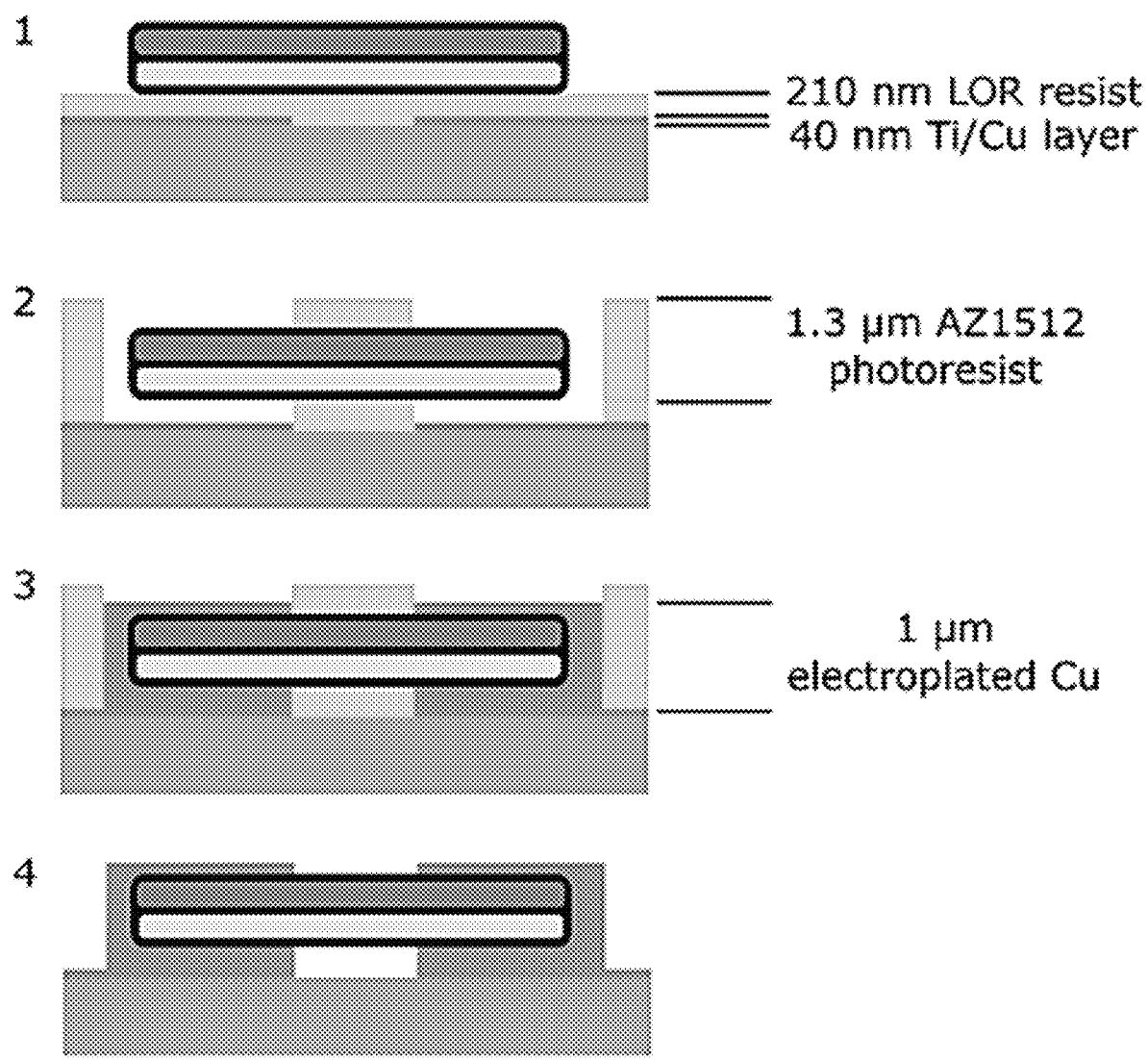
FIG. 12 is a flow diagram illustrating a formation of upper electrical contacts across the nanowires in accordance with embodiments of the present disclosure.

In an attempt to optimize the frequency for electrical assembly during testing, the frequency from 100 Hz-10 MHz was swept while observing the nanowires in solution. It appeared that a frequency of around 5 kHz performed well for the nanowires in the lower dielectric constant solvents. Hence, this frequency was used for assembly of the nanowires across the electrodes in the test array. FIG. 11 shows successfully assembled nanowires across the test electrodes using 42 volts peak to peak @ 5 kHz in butanol post barium carbonate removal. The linear density of the as assembled nanowires is found to be approximately 19 NWs/mm across 27 rows of nanowires. After assembly, the upper electrical contacts were formed with the nanowires via lithography and deposition of upper electrical contacts via copper electroplating as shown in FIG. 12. In particular, FIG. 12 provides a flow diagram illustrating a formation of upper electrical contacts across the nanowires in accordance with embodiments of the present disclosure via 1) patterning of Ti/Cu electrode patterns via sputtering and lift-off; spin coat blanket layer of LOR resist; assemble nanowires; 2) spin coating and patterning AZ1512 photoresist to expose ends of the nanowires; 3) electroplating copper to make electrical contacts with nanowire; and 4) stripping of the remaining photoresist.

The resultant linear density of the nanowire assembly post electrode deposition decreased to 3.6 NWs/mm. During deposition of the upper electrical contacts, this decrease in nanowire density can be attributed to the fact that some nanowires were not sufficiently long enough to be covered by the upper contacts, and loss of adhesion in the upper electrodes. While this density was sufficient to test the concept of using these nanowires to form a passive magnetoelectric magnetic field sensors and should allow for miniaturization, methods to produce a higher density of assembly will be the focus on ongoing research, to allow fabrication of devices with even smaller footprints. A higher density assembly could likely be achieved through the use of alternative solvents or further tuning of the assembly frequency, or the implementation of a microfluidic channel. To increase the proportion of nanowires which remain assembled across the electrodes through the process of depositing upper electrical contacts the proportion of the nanowires long enough to be covered by the electrodes could be increased. To do so the electrospinning parameter space could be further explored to increase the average length of the electrospun nanowires while maintaining a low variance in their distribution. To help adhesion of the upper contacts the surface of the chip or wafer could be cleaned via carbon dioxide snow cleaning after photolithography and before electrode deposition, between steps 2 and 3 in FIG. 12.

Since the AC electrical technique is conducive to assembling discrete nanowires 110 in solution, continuous fibers formed during electrospinning are to be broken into shorter nanowires. A method found to work well for this purpose is increasing the ramp rate during the burn off of the polymer post electrospinning and introducing salt into the annealing process. The increased ramp rate increases the rate at which the polymer is burned off from the nanofibers, thereby, increasing the rate at which the fibers shrink as well as the resulting tension during this process. This tension in turn causes the fibers to break apart axially forming discrete nanowires 110. The introduction of salt during the annealing process prevents nearby wires from sintering together.

For subsequent assembly, a nanowire slightly longer than the electrode gap may be desirable since the nanowire must bridge the electrode gap for electrical connections to be made and nanowires which are too long may quickly settle out of solution. As such, electrospinning and calcination parameters which can provide control of the nanowire lengths may be considered. Two such parameters are the electrospinning voltage and the calcination ramp rate (as discussed with respect to FIGS. 3-5). While these are not the only parameters which could control nanowire length, they are readily tuned and are likely generalizable to other systems. After assembly, upper electrical contacts can be created using lithography, sputter coating, and electroplating, in various embodiments. Additional improvements can be made to the electrospinning, electrical assembly, and upper electrode formation parameters to maintain reliable device fabrication in increasingly smaller electrode footprints, allowing even smaller devices to be manufactured. Furthermore, in some embodiments, all processing steps on the wafer are designed to be performed at low temperature, and thus, these devices can be readily integrated with on chip signal processing components with the potential to further reduce device size.

For an exemplary method for electrical assembly of Janus magnetoelectric nanofibers, after salt calcination, the salt is dissolved and the nanowires are immersed in a beaker of water. After which, a permanent magnet can be used to attract the nanowires to the bottom of the beaker. In one exemplary embodiment, excess water is decanted, and the nanowires are placed in dialysis tubing, and dialyzed in deionized water to remove the salt. For such water assemblies, 5 mg of citric acid can be added, subsequently raising the pH of the solution to a value of around 9 to better suspend the nanowires. Alternatively, for embodiments utilizing ethanol, 2-methoxyethanol, and/or butanol solvent solutions, the nanowires 110 can be placed in a centrifuge tube and nearly all of the water from the nanowires may be decanted while holding the nanowires in place with a permanent magnet. The nanowires may then be dried in a vacuum oven and the respective solvent added. The solution can then be sonicated and vortexed.

For embodiments utilizing the copper coated nanowire assembly, the nanowires can be first coated in a 100 nm sacrificial copper coating by evaporating nanowires suspended in isopropyl alcohol on microscope slides. Then, sputter coating may be applied to the nanowires on the slides. The glass slides may be sonicated in water to remove the nanowires from the slides. The nanowires may be better dispersed in the deionized water with the addition of citric acid and sodium hydroxide. For subsequent assembly across several rows of nanowires in series (series array), butanol may be used as the nanowire solvent solution.

During trials, initial assembly attempts of Janus nanowires in water, even after barium carbonate removal, were relatively unsuccessful with a weak dielectrophoretic force attracting the nanowires to the electrode gaps. However, barium titanate nanofibers ground with a mortar and pestle post barium carbonate removal exhibited strong positive dielectrophoresis, which suggests that the relatively low permittivity of cobalt ferrite decreases the dielectrophoretic force to a large extent.

After forming the sacrificial copper coating to make the nanowires more conductive, successful assembly may be achieved at low frequencies. Thus, the permittivity of the nanowire solvent solution relative to the nanowires was sought to be decreased to promote assembly.

It follows that given a sufficiently good copper coating, the nanowires can be assembled at lower frequencies, and the can could be successfully removed using a sodium hydroxide and copper sulfate solution. However, by changing to a lower dielectric constant solvent for assembly, such as butanol, assembly at higher frequencies (~5 kHz) in lieu of the copper coating may also be performed. Nonetheless, a sacrificial metal coating approach might also prove useful for other material systems.

Figure 13:
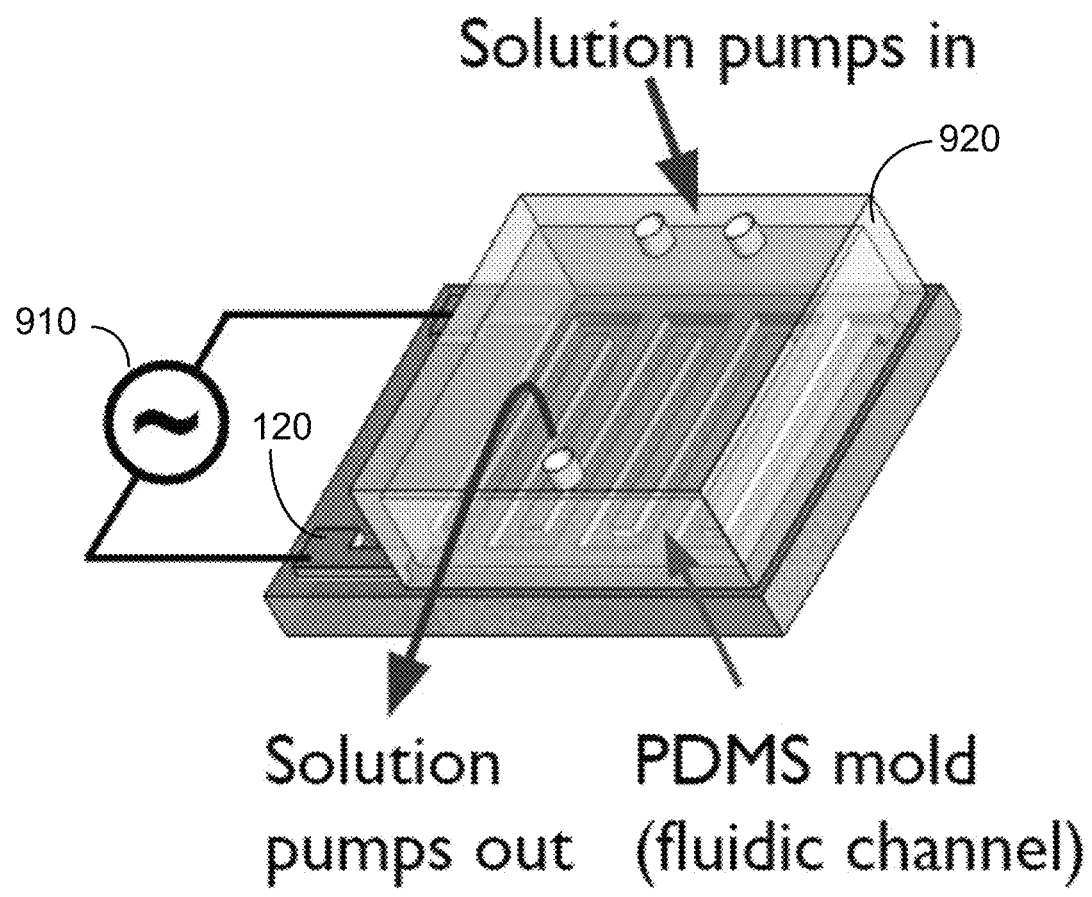
FIG. 13 is a diagram of an embodiment of an electrical assembly of a magnetic field sensor device in accordance with embodiments of the present disclosure.
Figure 14:
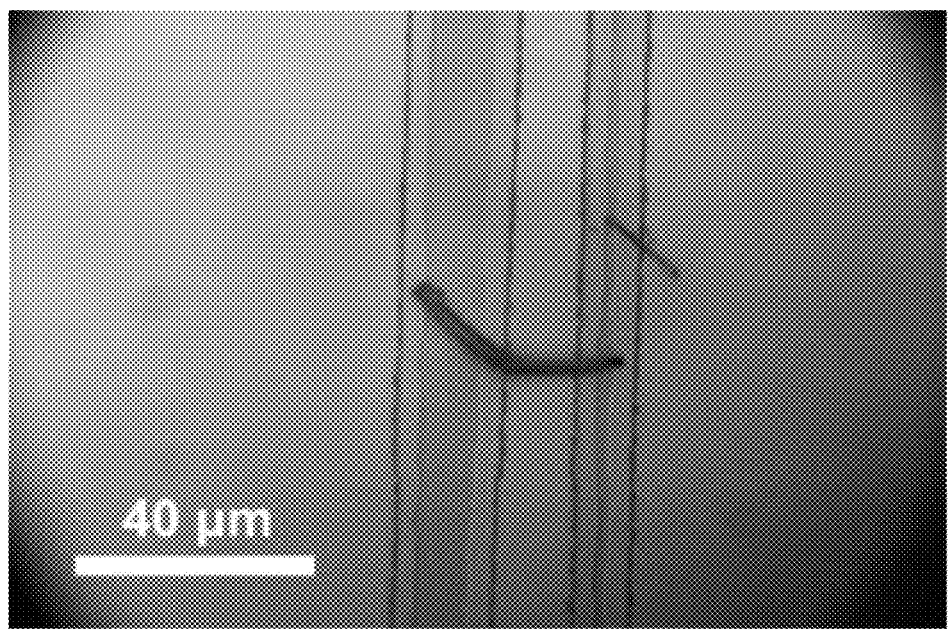
FIG. 14 is an image of the positioning of a magnetoelectric nanowire across an electrode gap in accordance with embodiments of the present disclosure.

Referring to FIG. 13, a diagram of an embodiment of an electrical assembly of a magnetic field sensor 100 in accordance with the present disclosure is depicted. In the figure, an AC voltage source 910 is coupled to contacts of the electrodes 120, such as inter-digitated electrodes in one embodiment. A chamber 920 is positioned over a portion of the electrodes 120 that allow for a solvent to be pumped in and out of the chamber 920. In one embodiment, the chamber may be in the form of a PDMS mold. Accordingly, a solvent may be added to the chamber 920 in addition with nanowires 110. The solvent is provided to enable the nanowires 110 to be arranged across the electrode gap that separates the electrodes 120, as demonstrated in FIG. 14. After the nanowires are arranged, the solvent may be pumped out or removed from the chamber 920 and the AC voltage source 910 may be removed.

During the electrical assembly, a droplet of the nanowire solvent solution can be placed over an electrode array in an exemplary embodiment, among others. For an exemplary assembly of nanowires in parallel across interdigitated electrodes, an AC voltage source in the form of a function generator can be set to supply a sinusoidal voltage of 20 Vpp from 100 Hz-10 MHz. During trials, the function generator was set to 5 kHz for a final assembly of non-copper coated wires and 100 Hz for a copper coated nanowire assembly. In an alternative embodiment involving a series array, a pulse generator capable of producing a voltage of 42 Vpp at 5 kHz was used during assembly of the nanowire fibers over the electrode gap, in some trials. After nanowire assembly, upper electrode contacts were formed with the nanowires via spin coating AZ1512 photoresist, optical lithography and removal of photoresist from the ends of the nanowires, electroplating copper, and stripping of the remaining photoresist.

Device Characterization

To evaluate operation of the exemplary embodiments of the magnetic field sensor devices 100, their respective effective magnetoelectric effects were measured in various trials, as explained below. As with previous characterizations of bulk and thin film magnetoelectrics, an AC-magnetic field was applied with a pair of Helmholtz coils, and this AC-magnetic field along with the output voltage of the nanowire arrays was used to calculate the effective magnetoelectric coefficients. Additionally, a rotational measurement setup was incorporated to eliminate inductive contributions to the effective magnetoelectric effect. Therefore, during an exemplary operation, a change in output voltage of the nanowire array can be detected to indicate the presence of a magnetic field. For example, a known magnetic field and the voltage output can be used to determine the magnetoelectric coefficient of the nanowire arrays. Then, to sense/measure a magnetic field, an embodiment of a magnetic field sensor 100 can use the voltage output and the (now known) magnetoelectric coefficient of the nanowire array(s) to calculate the magnetic field.

Figure 15:
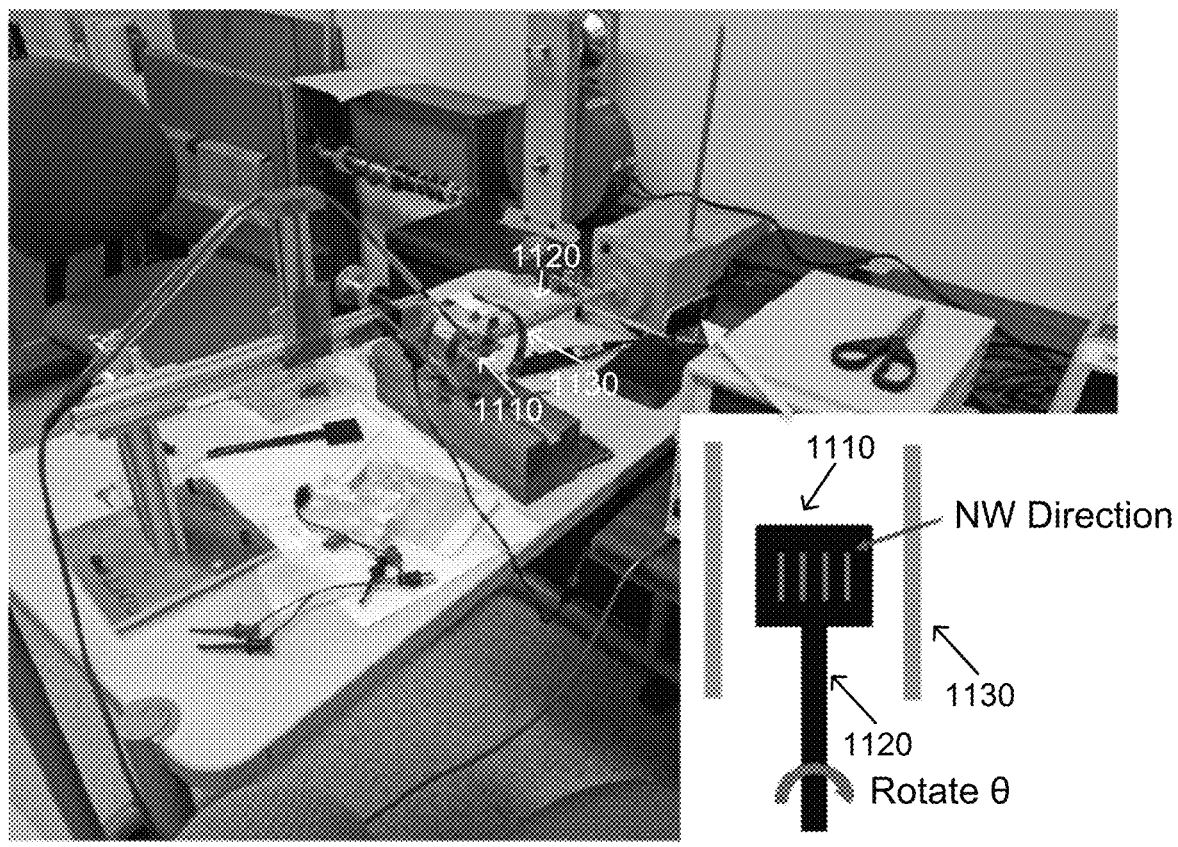
FIG. 15 is a diagram depicting a magnetoelectric measurement setup of an exemplary magnetic field sensor in accordance with embodiments of the present disclosure.

In one trial, a magnetoelectric measurement setup (FIG. 15) was constructed wherein the nanowire array 1110 was placed on a rotatable platform 1120 between two Helmholtz coils 1130, along with a Hall probe and pickup coil. To minimize any inductive contributions from the measurement setup, the nanowire array 1110 was rotated 360° with a voltage of 20 V at 10 kHz applied to the Helmholtz coils 1130 at 30° increments. The observations from these measurements were subsequently fit to a sine wave which was then used to determine the angle $\theta_0$ at which inductive effects have approximately no contribution to the output voltage of the array 1110.

Afterwards, the angle of rotation of the nanowire array 1110 was set to the angle $\theta_0$ of minimal to no contribution. A spectra of the magnetoelectric coefficient at frequencies ranging from 20 Hz to 20 MHz was determined by taking voltage amplitude measurements of the nanowire array 1110, pickup coil, current probe output from the Helmholtz coil 1130, and Hall probe output with 8 voltage inputs to the Helmholtz coil between 6 Vpp and 20 Vpp from the function generator (AC voltage source).

For testing/analyzing/calibrating (magnetoelectric coefficient determination), the Hall probe, Helmholtz coil current, and pickup coil voltage performed best in different frequency ranges. Accordingly, in one embodiment, each may be used to measure the magnetic field at different frequencies. For example, from various trials, the operating range of the Hall probe is between 0 Hz and 5 kHz. Thus, the Helmholtz coil current can be trusted up to 500 kHz. After which, the Helmholtz coil experiences resonance and then, the pickup coil becomes the most reliable method to measure the magnetic field. Thus, a conversion constant between the Helmholtz coil current to magnetic field using the Hall probe (between 0 Hz and 320 Hz) and a conversion constant for the pickup coil using the Helmholtz coil (between 320 Hz and 70 kHz) can be determined for use in testing/analyzing/calibrating an exemplary magnetic sensor device 100 over different frequency ranges. The Hall probe/Helmholtz coil/pickup coil may not be present in actual operation of an embodiment of the magnetic field sensor device 100, and instead are used to obtain a table of magnetoelectric coefficients versus frequency measurements.

Figure 16:
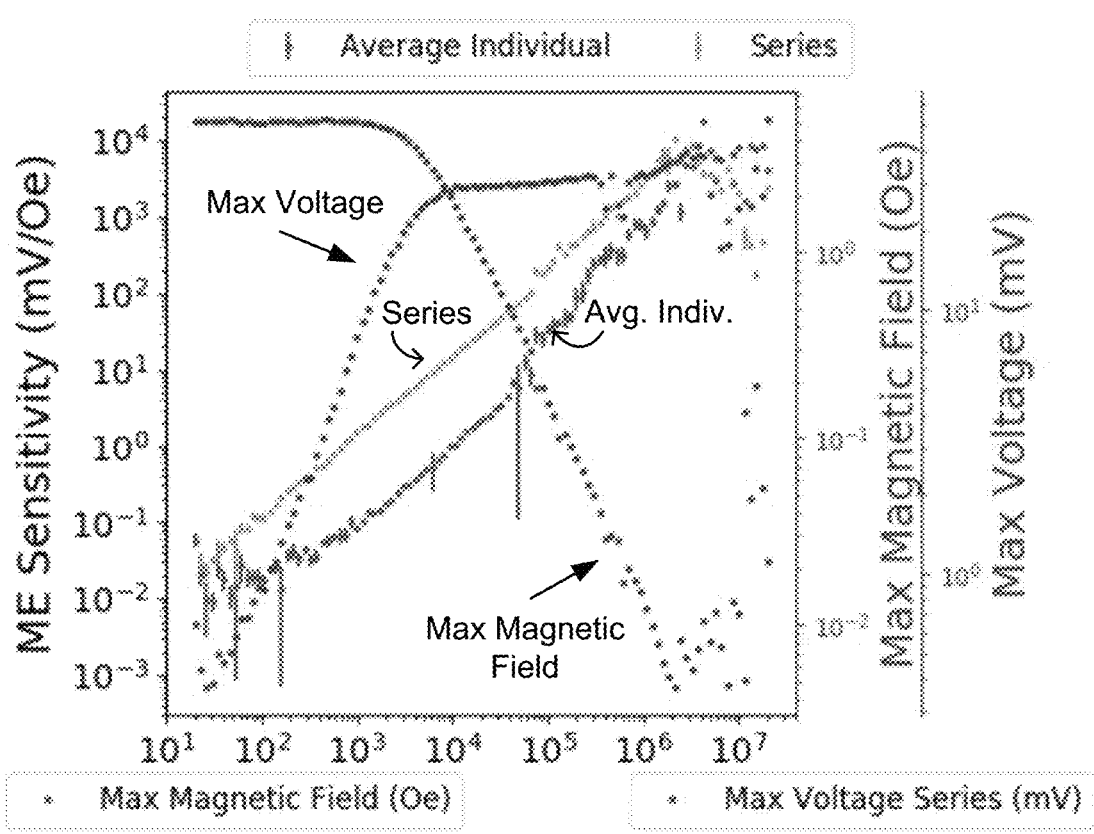
FIG. 16 is a graph of the relationship between minimum/maximum magnetoelectric coefficients across various frequencies for an exemplary series array of nanowires in accordance with embodiments of the present disclosure.
Figure 17:
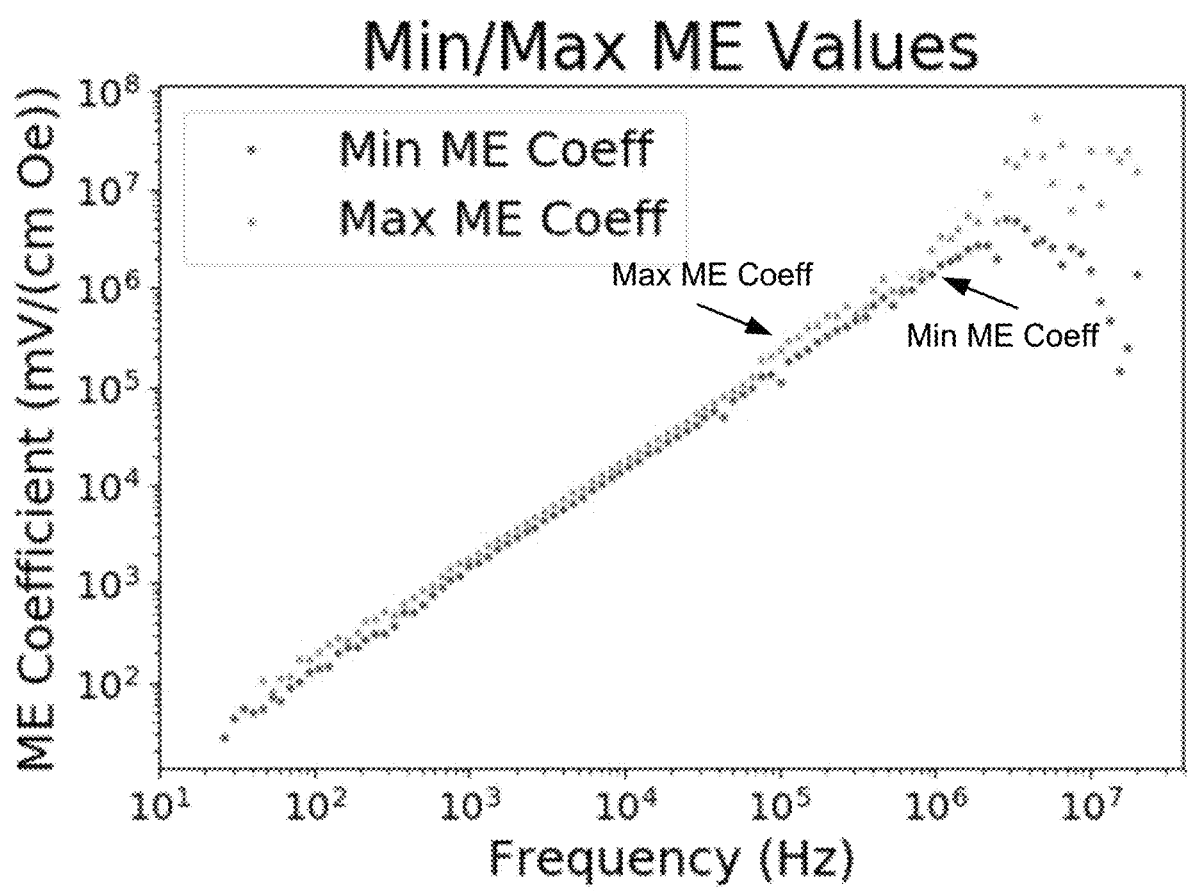
FIG. 17 is a graph of the relationship between the magnetoelectric sensitivities across various frequencies for an exemplary series array of nanowires in accordance with embodiments of the present disclosure.

FIG. 16 shows the minimum and maximum magnetoelectric coefficients, $\alpha$, of the rows of a series array with 23 rows of nanowires at each frequency between 20 Hz and 20 MHz, excluding measurements with a high standard deviation $\sigma > \frac{1}{10} E[\alpha]$. It can be seen that the effective magnetoelectric coefficient measured increases with frequency up to the MHz regime. However, measurements in this range may be less accurate due to Helmholtz resonance. It can also be seen that the largest variation across rows is low at most frequencies. FIG. 17 gives the magnetoelectric sensitivity (mV Oe$^{-1}$) of the 23 rows of nanowires in series compared to the average of each row. The magnetoelectric sensitivity across the entire array is less than 23× the average magnetoelectric sensitivity of each row, likely due to additional parasitic capacitances.

Figure 18:
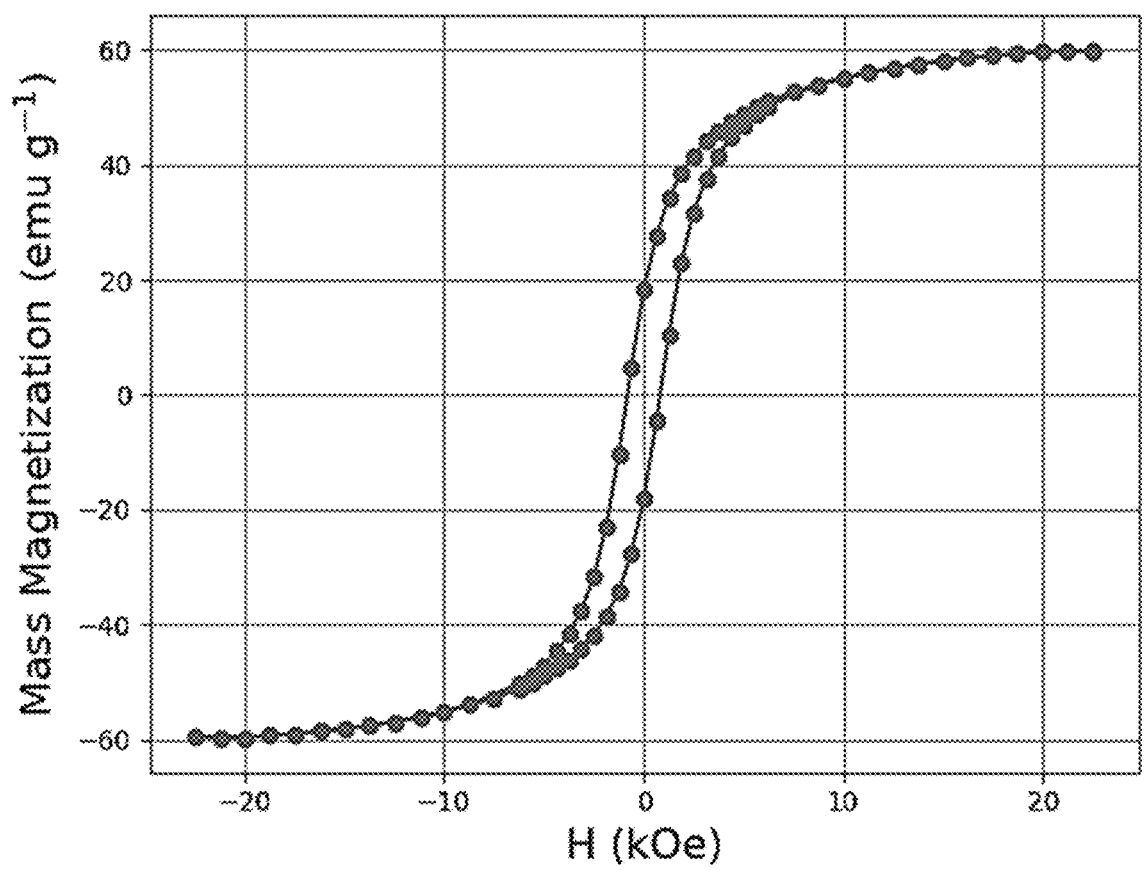
FIG. 18 is a graph showing a mass magnetization curve indicating ferrimagnetism in the cobalt ferrite phase of Janus nanowires in accordance with embodiments of the present disclosure.

A sample of calcined nanowires (not assembled, but from the same batch used for the assembly process) was measured by a vibrating sample magnetometer (VSM) to confirm a ferrimagnetic response. For the magnetization vs H-field (M-H) curve (FIG. 18), the field was swept from 22 kOe to −22 kOe, then swept back up to 22 kOe. FIG. 18 shows the hysteresis loop for the randomly oriented nanowires, showing a saturation of 60 emu/g, a remanence of ~18 emu/g, and a coercivity of ~0.8 kOe.

Figure 19:
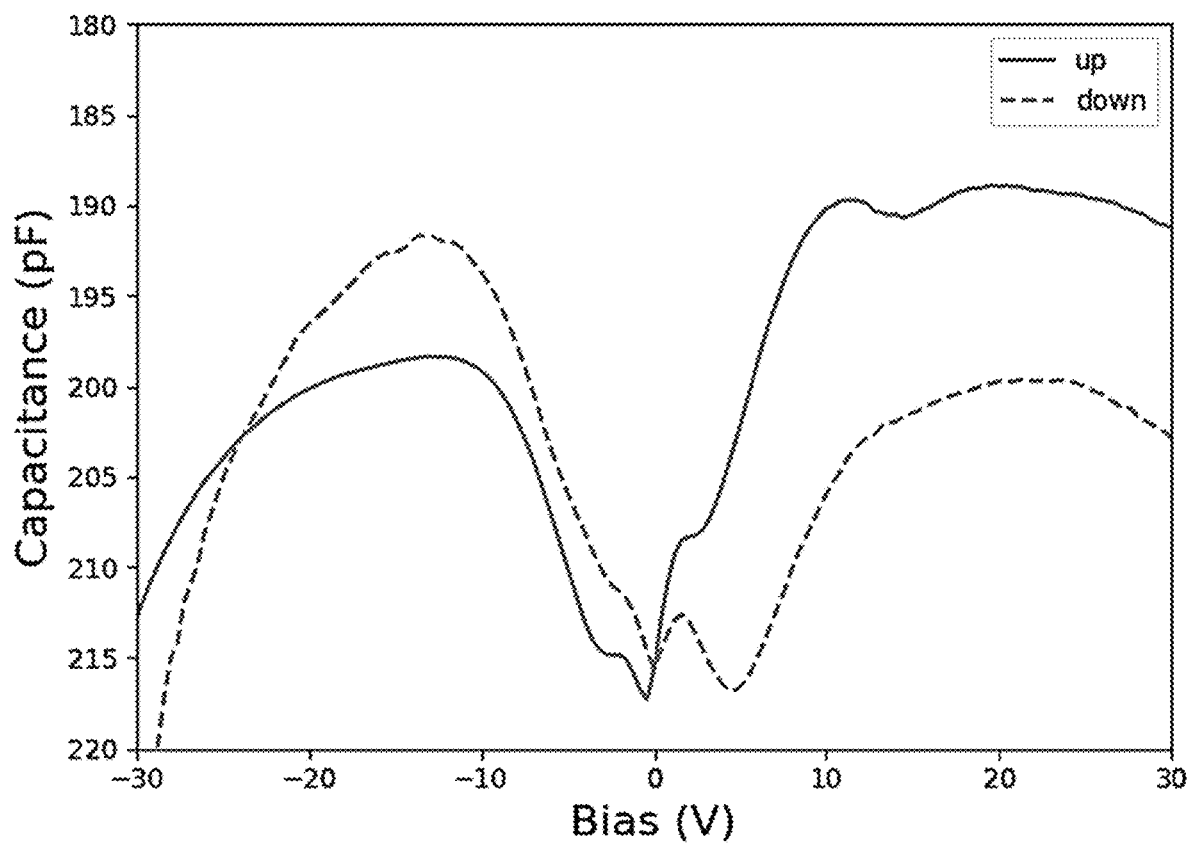
FIG. 19 is a graph showing capacitance and voltage (C-V) measurements from a Janus nanowire array in accordance with embodiments of the present disclosure.

FIG. 19 shows the capacitance-voltage (C-V) curves for an assembled row of Janus nanowires. The C-V bias voltage was swept from −30 V to +30 V and from −30 V to +30 V with an AC source voltage of 100 mV and frequency of 750 kHz. A low AC source voltage was desired for the nanowire C-V curves so that the AC signal would have a minimal effect on the polarization state of the ferroelectric barium titanate. The data for the nanowires shows a hysteretic behavior for the up sweep and down sweep, confirming both electrical connectivity and a ferroelectric response due to the barium titanate in the wires.

Figure 20:
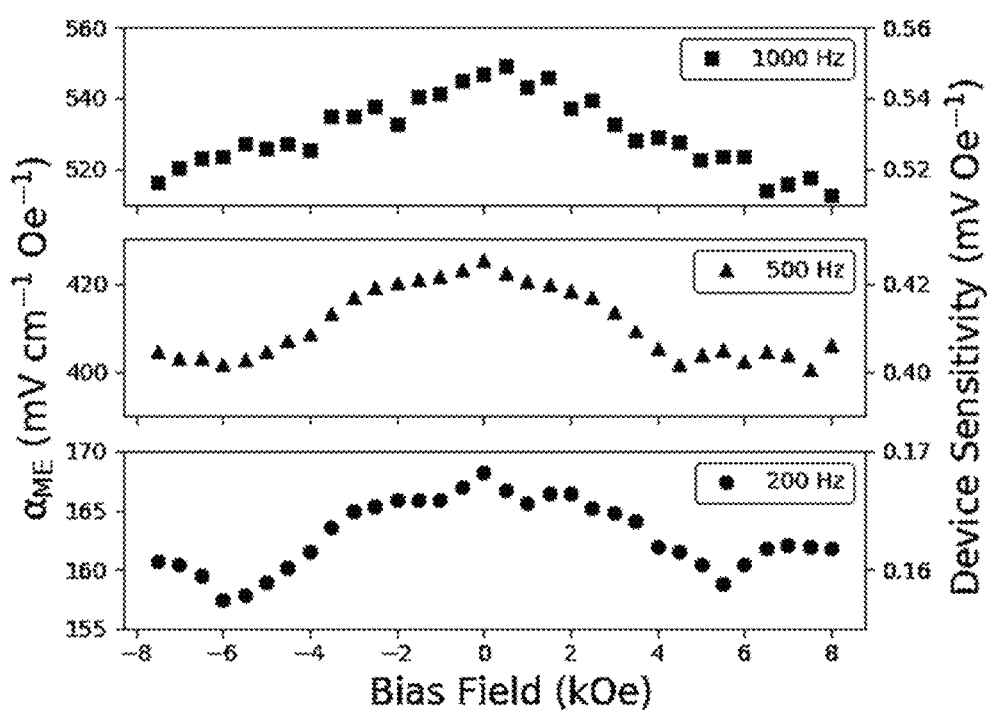
FIG. 20 is a plot of the magnetoelectric coefficients of a row in a Janus nanowire array measured using the lock-in technique as a function of magnetic bias field at 200 Hz, 500 Hz, and 1000 Hz in accordance with embodiments of the present disclosure.
Figure 21A:
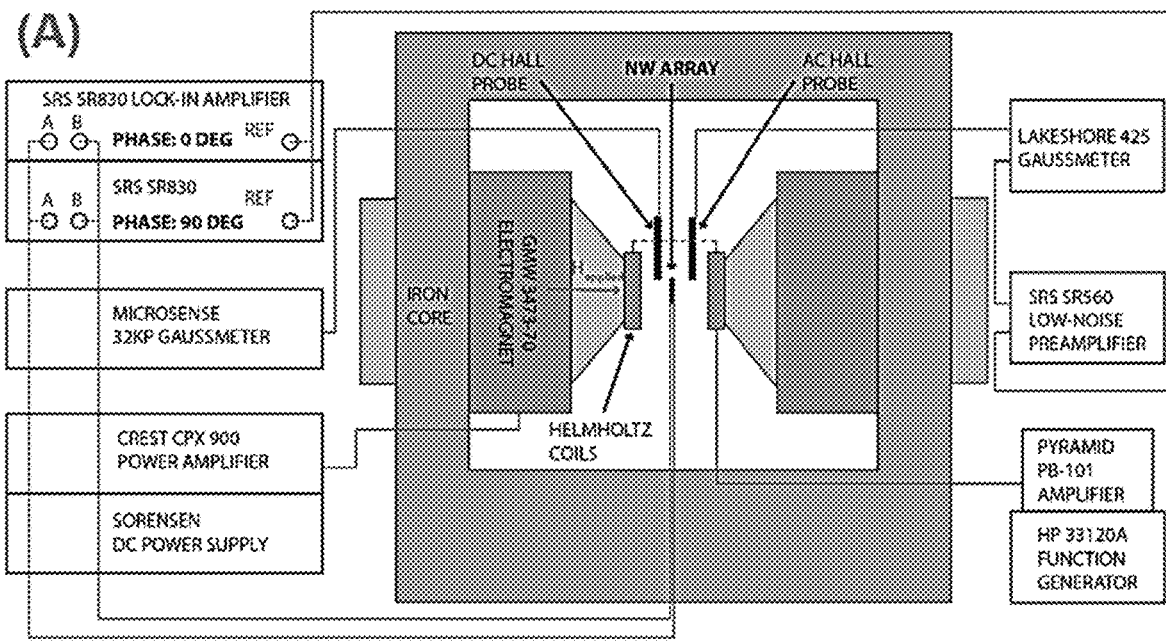

The magnetoelectric coefficients, as measured by a lock-in technique (see FIGS. 21A-B), of a row of nanowires in the nanowire array are shown in FIG. 20 as a function of bias field at 200, 500, and 1000 Hz. Here, for all three frequencies, a zero bias magnetoelectric effect is observed. Where previously observed, this effect has been attributed to remanent magnetization in the magnetic phase, which is consistent with the remanence observed in the magnetic hysteresis loops of the nanowires. This phenomenon can be thought of as a "self-biasing" effect, in that the remanent magnetization of the wires creates an internal demagnetizing field that provides a bias field to the magnetic phase.

At very high bias fields, both positive and negative, there is a relatively sharp drop in the magnetoelectric response. This drop is attributed to a saturation of magnetostriction in the cobalt ferrite phase. It is worth noting that many previous magnetoelectric publications use a much smaller range of bias fields (commonly only 6 kOe), and consequently may not have observed this effect.

FIG. 20 also reveals a general increase in magnetoelectric coefficient with frequency, which has been previously reported and can be attributed to changes in the dielectric constant of the constituent phases as a function of frequency. This likely leads to a reduction in charge leakage through the magnetostrictive cobalt ferrite phase with increasing frequency. In the 1000 Hz measurement, a slight increase in the observed magnetoelectric effect in the nanowire array is seen as a function of bias field starting around 10 kOe.

Hysteretic effects are also observed for the increasing and decreasing field sweeps. For example, as the bias voltage is reduced from 20 kOe to 0 kOe the dynamic magnetostriction in cobalt ferrite remains saturated below the bias field value initially needed to saturate the material. Particularly it is observed that at each frequency the point at which this desaturation occurs is near 10 kOe. It is important to note that there are some apparent differences in the nature of the hysteresis effect observed in the magnetization vs H-field loop (the M-H loop) and the magnetoelectric measurements. While the slope of the M-H loop informs to some extent what is expected to be observed in the magnetoelectric measurements, this slope is definitionally related to the differential susceptibility of the cobalt ferrite phase. In contrast, the magnetoelectric measurements depend on the dynamic magnetostriction, which depends on the dynamic susceptibility.

Figure 21B:
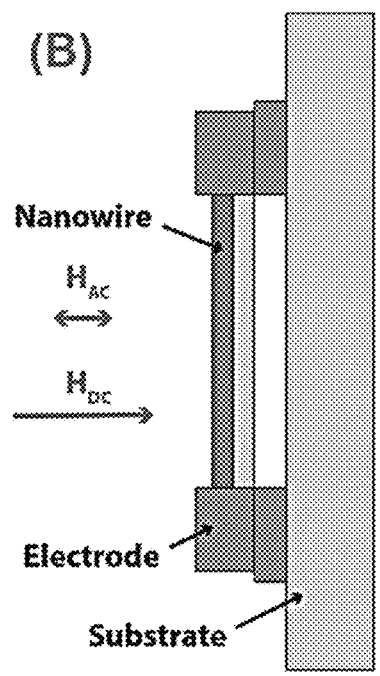

As discussed above and shown in FIG. 21A, a lock-in measurement setup was used to measure the magnetoelectric effect in the nanowire arrays as a function of bias field and frequency. As shown in FIG. 21B, the magnetic fields were applied transverse to the long axis of the nanowires. The DC bias field Hoc was cycled from 0 kOe up to 20 kOe, then down to −20 kOe, and finally back to 0 kOe using a GMW 3473-70 electromagnet with a 5 second dwell at each bias field value. The DC bias field was measured using a Hall probe and Microsense Gaussmeter, which also provided closed-loop control of the current delivered to the electromagnet. A small AC field at 200, 500, or 1000 Hz was applied via Helmholtz coils placed at the electromagnet poles. The Helmholtz coils were powered using a Hewlett Packard 33120A function generator and a Pyramid PB-101 amplifier. For each frequency, a 1 Oe AC field amplitude was targeted, but the actual AC field amplitude varied with the DC bias field by ~20% due to changes in the reluctance of the electromagnet. Consequently, the actual applied AC field was measured by a second hall probe connected to a Lakeshore 425 Gaussmeter for use in calculating the magnetoelectric coefficient. The analog output of the AC field signal from the Gaussmeter was amplified by a Stanford Research Systems SR560 low-noise preamplifier and served as the phase reference for the lock-in measurements. The voltage from the nanowire array was measured using two Stanford Research Systems SRS830 lock-in amplifiers phase locked at 0 and 90 degrees relative to the AC magnetic field.

The voltage waveform produced by the nanowire array is a combination of the magnetoelectric response as well as an electromagnetic induction. For a sinusoidal excitation, these two constituent signals would each be sinusoids at the same frequency as the applied AC magnetic field, but they would be expected to have differing phases (relative to the AC magnetic field). The total measured signal can thus be expressed in phasor form as $\tilde{V}_{MEAS} = \tilde{V}_{ME} + \tilde{V}_{IND}$, where a tilde over a variable is used to indicate that it is a phasor. Thus, an experimental challenge is to extract only the magnetoelectric signal $V_{ME}$ from the lock-in measurement. To do so, it is noted that in a saturation condition (e.g. at very high DC bias field), there would be no magnetoelectric response, i.e. $\tilde{V}_{MEAS,saturation} = \tilde{V}_{IND}$. Additionally, it is assumed that the induction signal $\tilde{V}_{IND}$ is independent of the bias field given a constant applied AC field, whereas $\tilde{V}_{ME}$ is expected to vary with bias field. Consequently, the magnetoelectric voltage is obtained by simple phasor subtraction of the induction signal from the measured signal, i.e. $V_{ME} = V_{MEAS} - \tilde{V}_{IND}$. As previously mentioned, the applied AC field magnitude (and likewise the phasor $\tilde{V}_{IND}$) varied slightly from 1 Oe during the measurements. Thus, in the implementation, $\tilde{V}_{IND}/|H_{AC}|$ was determined at saturation, and the induction voltage at all other bias field conditions was calculated as follows:

$$\tilde{V}_{IND} = \frac{\tilde{V}_{IND,saturation}}{|H_{AC,saturation}|} \cdot |H_{AC}|. \quad (Eq.\ 3)$$

Finally, the magnetoelectric voltage was determined from $$\tilde{V}_{ME} = \tilde{V}_{MEAS} - \tilde{V}_{IND} \quad (Eq.\ 4)$$

and subsequently the magnetoelectric coefficient was calculated as $$\alpha_V = \frac{|\tilde{V}_{ME}|}{L \cdot |H_{AC}|}, \text{ where } L = 10 \text{ μm}. \quad (Eq.\ 5)$$

Figure 22:
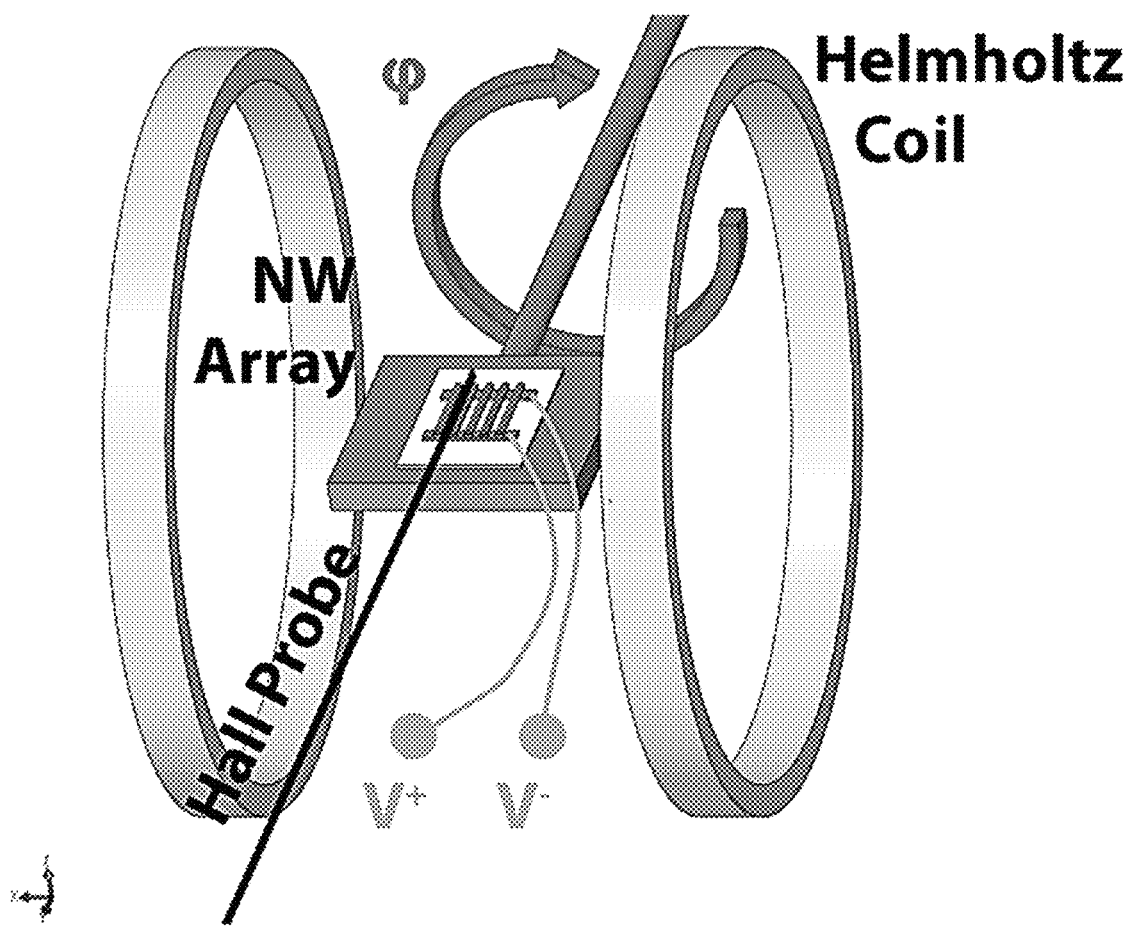
FIG. 22 is a schematic of a rotating magnetoelectric measurement setup to explore the effects of induction on a measured magnetoelectric coefficient in accordance with embodiments of the present disclosure.

The nanowires generate sufficiently large voltage to allow direct measurement of the output voltage using an oscilloscope. To obtain additional zero-bias magnetoelectric measurements at additional frequencies up to 10 kHz, a rotational magnetoelectric measurement setup was constructed as shown in FIG. 22.

In this setup, the nanowire array substrate is placed on a stage that facilitates physical rotation of the substrate in order to explore the influence of unwanted electromagnetic induction in the output signal. The induction arises due to the finite cross-sectional area determined by the substrate electrode geometry and connecting wires.

During testing, an AC magnetic field (ranging from 1 to 5 Oe) was applied to the nanowire array via Helmholtz coils driven by a function generator. As before, the magnetic fields were applied perpendicular to the long axis of the nanowires. The AC field was measured by a Lakeshore Hall Probe, and the output voltage is measured via a Tektronix DPO2004 Oscilloscope.

With a voltage of 20 $V_{pp}$ @ 10 kHz applied to the Helmholtz coils, the nanowire array was rotated 360° in 30° increments, where the rotation angle is defined as $\varphi$. During this rotation, the fields acting on the nanowires remain in the same direction, but the electromagnetic induction varies both constructively and deconstructively. The observations from this measurement were subsequently fit to a cosine wave, which was then used to determine the angle $\varphi_0$ at which inductive effects have approximately no contribution to the output voltage of the array. Here, the angles at which induction has the maximum additive and subtractive contribution were also determined. For subsequent experiments, the substrate was positioned at angle appropriate angle $\varphi_0$ to minimize inductive effects. This setup allows for the angle of the array with respect to the applied magnetic field to be adjusted in order to explore the influence of electromagnetic induction in the measurement.

Figure 23A:
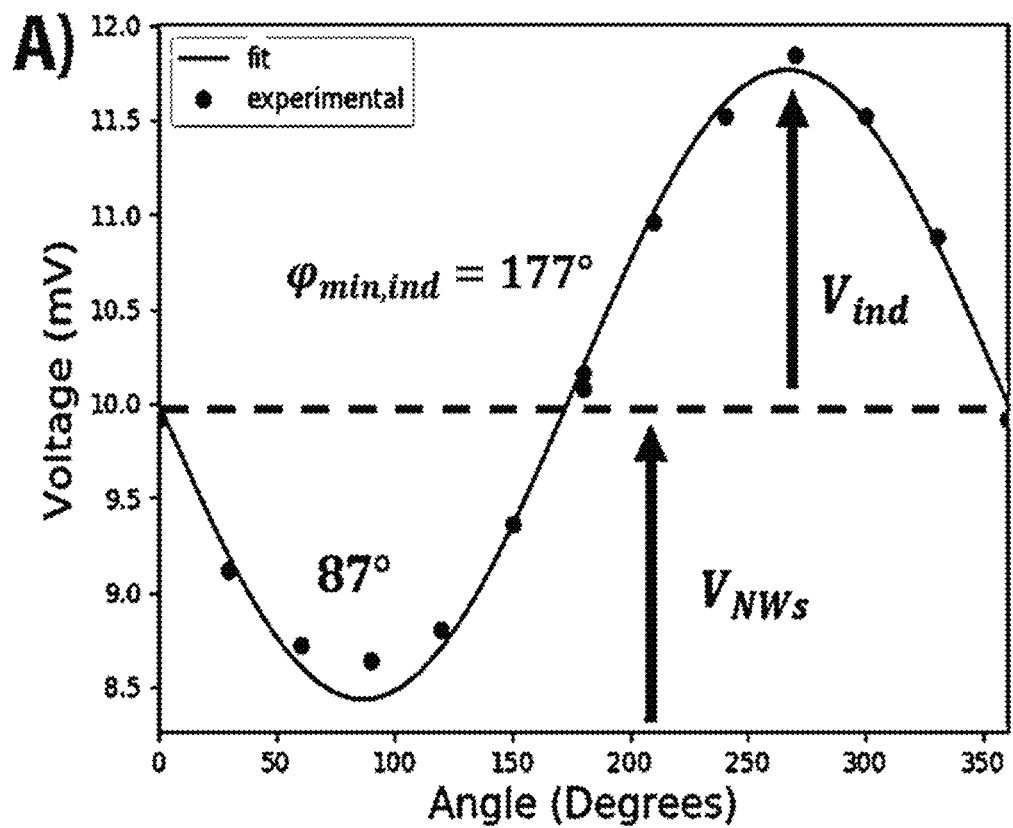
FIG. 23A depicts a graph of the relationship between the rotation of the nanowire array and inductive contributions to measured voltage generated by the nanowire array in accordance with embodiments of the present disclosure.

FIG. 23A shows the voltage output of the nanowire array as a function of the angle of the nanowire array with respect to a 1 kHz applied AC field. Here, it can be seen that there is an inductive contribution which is angle dependent an angle independent magnetoelectric response. As expected, the inductive contribution is sinusoidal and can be fit to find the angle of zero inductive contribution $\varphi_0 = 177°$.

Figure 23B:
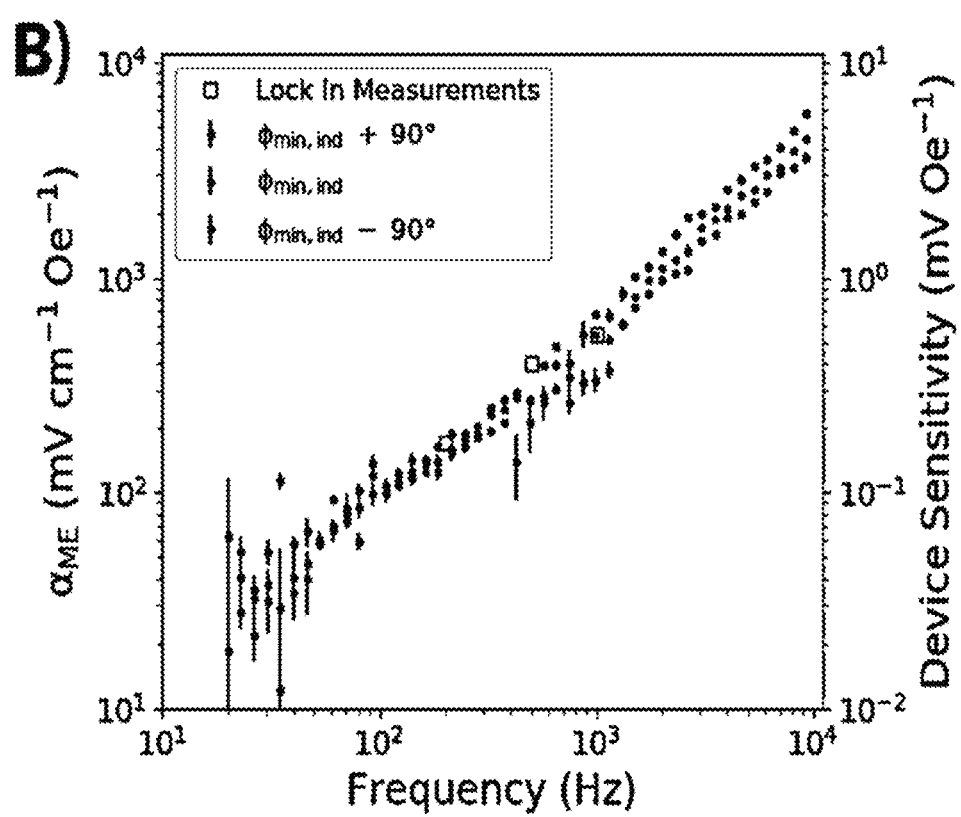
FIG. 23B depicts a graph of the relationship between measured magnetoelectric coefficients from a nanowire array at angles of maximum constructive induction in accordance with embodiments of the present disclosure.

The results of direct magnetoelectric measurement spectra can be seen in FIG. 23B which compares the effective magnetoelectric coefficients as measured at $\varphi_0$, an angle with induction additive to the magnetoelectric effect $\varphi_0 + 90°$ and an angle at which induction which opposes the magnetoelectric effect $\varphi_0 - 90°$. From the figure, it can be observed that the maximum inductive contribution of the nanowire array is much smaller than the magnetoelectric effect (15% when rotated to an angle at which the maximum inductive contribution occurred at 1 kHz).

In particular, FIG. 23B shows the measured device response from 20 Hz to 10 kHz. Again, a general increase in magnetoelectric effect with respect to increasing frequency is found, and there is good agreement with the lock-in measurements (denoted by the squares). For the case of minimal induction, magnetoelectric coefficients with zero bias at 200 Hz, 500 Hz, and 1 kHz were found to increase from 152±13 mV cm$^{-1}$ Oe$^{-1}$ to 267±14 mV cm$^{-1}$ Oe$^{-1}$ to 514±27 mV cm$^{-1}$ Oe$^{-1}$. These values correspond to device sensitivities of 0.152±0.013 mV Oe$^{-1}$ to 0.267±0.014 mV Oe$^{-1}$ to 0.514±0.027 mV Oe$^{-1}$, at 200 Hz, 500 Hz, and 1 kHz, respectively.

After completing the magnetoelectric measurements, it was found that the nanowires of the present disclosure exhibit significantly larger magnetoelectric coefficients (514±27 mV cm$^{-1}$ Oe$^{-1}$ at 1 kHz) compared to values previously observed with this material system. For example, bulk barium titanate/cobalt ferrite systems have been shown to demonstrate magnetoelectric coefficients of 50 mV cm$^{-1}$ Oe$^{-1}$ at 60 kHz. Zhang et al. reported 104 mV cm$^{-1}$ Oe$^{-1}$ at 1 kHz for BTO-CFO single crystal thin films. See Zhang, Y., Deng, C., Ma, J., Lin, Y. & Nan, C.-W., "Enhancement in magnetoelectric response in CoFe2O4-BaTiO3 heterostructure," *Appl. Phys. Lett.* 92, 062911 (2008). The increased magnetoelectric coefficient observed in the nanowire arrays in comparison to thin films seems reasonable based on theoretical study of substrate clamping effects and PFM measurements made by Xie et al. on PZT-CFO fibers and a comparison to PZT-CFO thin films. See Zhang, C. L., Chen, W. Q., Xie, S. H., Yang, J. S. & Li, J. Y., "The magnetoelectric effects in multiferroic composite nanofibers," *Appl. Phys. Lett.* 94, 102907 (2009); Xie, S.-H., Liu, Y.-Y. & Li, J.-Y., "Synthesis, microstructures, and magnetoelectric couplings of electrospun multiferroic nanofibers," *Front. Phys.* 7, 399-407 (2012); and Wan, J. G. et al., "Magnetoelectric CoFe2O4-Pb(Zr,Ti)O3 composite thin films derived by a sol-gel process," *Appl. Phys. Lett.* 86, 122501 (2005).

In accordance with the present disclosure, an embodiment of a magnetic field sensor is fabricated via the assembly of arrays of magnetoelectric nanowires using methods that are readily scalable, economical, and CMOS compatible. Exemplary magnetoelectric nanowires with controllable lengths can be prepared by tuning both the electrospinning and calcination conditions and that dielectrophoretic assembly methods allow the fabrication of functional arrays of magnetoelectric nanowires. In various embodiments, by utilizing magnetoelectric nanowires suspended across electrodes above the substrate, substrate clamping is reduced when compared to layered thin-film architectures; this results in enhanced magnetoelectric coupling. Exemplary Janus magnetoelectric nanowires may be fabricated by sol-gel electrospinning, and their length controlled through the electrospinning and calcination conditions. Using a directed nanomanufacturing approach, the nanowires may then be assembled onto pre-patterned metal electrodes on a silicon substrate using dielectrophoresis. Using this process, functional magnetic field sensors can be formed by connecting many nanowires in parallel. From testing, the observed magnetic field sensitivity from such a parallel array of nanowires is $0.514 \pm 0.027$ mV Oe$^{-1}$ at 1 kHz, which translates to a magnetoelectric coefficient of $514 \pm 27$ mV cm$^{-1}$ Oe$^{-1}$.

In operation, for various embodiments of a magnetic field sensor of the present disclosure, a current trace is positioned perpendicular to an array of the magnetoelectric nanowires such that a time varying current traveling over the current trace can induce an AC-magnetic field. In this way, the magnetic field sensor can be deployed as a current sensor, in some embodiments.

Herein, the present disclosure describes various fabrication techniques and passive magnetic field sensors using 1-D magnetoelectric nanostructures. Such a magnetic field sensor in accordance with embodiments of the present disclosure does not require an external power supply to generate a voltage indicating the presence of a magnetic field (apart from the power supply used by a detection device to read the generated voltage). It should be emphasized that the above-described embodiments of the present disclosure are merely possible examples of implementations, merely set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

Therefore, at least the following is claimed:

1. A magnetic field sensor device comprising:
    a first electrode positioned across a second electrode, wherein an electrode gap separates the first electrode and the second electrode;
    a magnetoelectric nanowire connected to the first electrode and the second electrode across the electrode gap without substrate clamping;
    wherein the magnetoelectric nanowire generates a voltage response in a presence of a magnetic field.

2. The magnetic field sensor device of claim 1, further comprising a current trace positioned perpendicular to an array of magnetoelectric nanowires, wherein the magnetic field is induced by a time varying current traveling over the current trace.

3. The magnetic field sensor device of claim 1, wherein the magnetoelectric nanowire comprises a piezoelectric material coupled with a magnetostrictive material.

4. The magnetic field sensor device of claim 3, wherein the piezoelectric material coupled with the magnetostrictive material comprises barium titanate coupled with cobalt ferrite.

5. The magnetic field sensor device of claim 3, wherein the piezoelectric material coupled with the magnetostrictive material comprises PZT (lead zirconate titanate) coupled with nickel zinc (NiZn) ferrite.

6. The magnetic field sensor device of claim 1, wherein the magnetic field sensor device comprises a series of magnetoelectric nanowires that span between respective pairs of electrodes, wherein the series of magnetoelectric nanowires include the magnetoelectric nanowire connected to the first electrode and the second electrode.

7. The magnetic field sensor device of claim 1, wherein the magnetic field sensor device comprises a collection of magnetoelectric nanowires having respective pairs of electrodes that are coupled in parallel with one another, wherein the collection of magnetoelectric nanowires include the magnetoelectric nanowire connected to the first electrode and the second electrode.

8. The magnetic field sensor device of claim 1, wherein the magnetoelectric nanowire comprises a Janus morphology.

9. The magnetic field sensor device of claim 1, wherein the magnetoelectric nanowire comprises a core shell morphology.

10. The magnetic field sensor device of claim 1, wherein the magnetoelectric nanowire comprises a randomly dispersed morphology.

11. The magnetic field sensor device of claim 1, wherein the first electrode and the second electrode form interdigitated electrodes.

12. A method comprising:
    fabricating 1-D magnetoelectric nanofibers;
    forming 1-D magnetoelectric nanofibers into shorter 1-D magnetoelectric nanowires;
    using dielectrophoresis to orient a 1-D magnetoelectric nanowire across an electrode gap separating a pair of electrodes; and
    measuring a voltage response induced by the 1-D magnetoelectric nanowire in a presence of a magnetic field.

13. The method of claim 12, further comprising establishing upper electrical contacts.

14. The method of claim 12, wherein the magnetoelectric nanowire is oriented with solvent across the electrode gap using a dielectrophoretic force.

15. The method of claim 14, wherein the solvent comprises water, ethanol, 2-methoxyethanol, or butanol.

16. The method of claim 12, wherein the magnetoelectric nanofibers are fabricated by sol-gel electrospinning.

17. The method of claim 12, wherein the magnetoelectric nanowire comprises a piezoelectric material coupled with a magnetostrictive material.

18. The method of claim 12, wherein the magnetoelectric nanowire comprises a Janus morphology.

19. The method of claim 12, wherein the magnetoelectric nanowire comprises a core shell morphology.

20. The method of claim 12, wherein the magnetoelectric nanowire comprises a randomly dispersed morphology.

21. The method of claim 12, wherein the pair of electrodes forms inter-digitated electrodes.

22. The method of claim 12, further comprising forming a sacrificial metal coating on the magnetoelectric nanowire.

23. The method of claim 22, wherein the metal comprises copper.

\* \* \* \* \*